United States Patent
Kubota et al.

(10) Patent No.: US 9,343,650 B2
(45) Date of Patent: May 17, 2016

(54) PIEZOELECTRIC MATERIAL, PIEZOELECTRIC ELEMENT, MULTILAYERED PIEZOELECTRIC ELEMENT, LIQUID EJECTION HEAD, LIQUID EJECTION APPARATUS, ULTRASONIC MOTOR, OPTICAL EQUIPMENT, VIBRATION APPARATUS, DUST REMOVING APPARATUS, IMAGING APPARATUS, AND ELECTRONIC EQUIPMENT

(71) Applicants: CANON KABUSHIKI KAISHA, Tokyo (JP); FUJI CHEMICAL CO., LTD., Osaka-shi (JP)

(72) Inventors: Makoto Kubota, Yokohama (JP); Jumpei Hayashi, Yokohama (JP); Fumio Uchida, Daito (JP); Kenji Maeda, Hirakata (JP); Chiemi Shimizu, Hirakata (JP)

(73) Assignees: FUJI CHEMICAL CO., LTD., Osaka-shi (JP); CANON KABUSHIKI KAISHA, Tokyo (JP)

( * ) Notice: Subject to any disclaimer, the term of this patent is extended or adjusted under 35 U.S.C. 154(b) by 255 days.

(21) Appl. No.: 14/217,725

(22) Filed: Mar. 18, 2014

(65) Prior Publication Data
US 2014/0292160 A1 Oct. 2, 2014

(30) Foreign Application Priority Data
Mar. 29, 2013 (JP) .................. 2013-071016

(51) Int. Cl.
*H01L 41/187* (2006.01)
*H01L 41/047* (2006.01)
(Continued)

(52) U.S. Cl.
CPC .......... *H01L 41/0477* (2013.01); *H01L 41/083* (2013.01); *H01L 41/1871* (2013.01); *H01L 41/1878* (2013.01); *H01L 41/257* (2013.01); *H01L 41/273* (2013.01)

(58) Field of Classification Search
CPC ... H01L 41/187; H01L 41/18; H01L 47/1871; H01L 41/1873; H01L 41/1878; C04B 35/495; C04B 35/46
USPC ................. 310/358; 252/62.9 R; 501/134
See application file for complete search history.

(56) References Cited

U.S. PATENT DOCUMENTS

| 8,354,038 B2 * | 1/2013 | Wang ................. C01G 33/006 252/62.9 PZ |
| 8,529,785 B2 | 9/2013 | Kubota et al. |

(Continued)

FOREIGN PATENT DOCUMENTS

| JP | 4-60073 B2 | 9/1992 |
| JP | 4510966 B2 | 7/2010 |

OTHER PUBLICATIONS

Saburo Nagakura et al. (ed.), Iwanami Dictionary of Physics and Chemistry, 5th Edition, p. 1268-1269 (Iwanami Shoten, Publishers; Feb. 20, 1998).

(Continued)

*Primary Examiner* — Derek Rosenau
*Assistant Examiner* — Bryan Gordon
(74) *Attorney, Agent, or Firm* — Fitzpatrick, Cella, Harper & Scinto

(57) ABSTRACT

Provided is a lead-free piezoelectric material having a satisfactory and stable piezoelectric constant and electric insulation property in a wide practical temperature range. Provided is a piezoelectric material, including a perovskite-type metal oxide represented by the following general formula (1) as a main component, the piezoelectric material containing Mn in a content of 0.01 part by weight or more and 0.80 part by weight or less with respect to 100 parts by weight of the perovskite-type metal oxide: $(Li_\alpha Na_{\alpha\prime} K_{\alpha\prime\prime} Ba_\beta Bi_{0.5\alpha+\gamma})_a (Ti_{\alpha+\beta}Fe_\gamma)O_3 \ldots$ (1), where $0.800 \le \alpha \le 0.999$, $0 \le \beta \le 0.150$, $0.001 \le \gamma \le 0.050$, $\alpha+\beta+\gamma=1$, $0 \le x \le 0.050$, $0.045 \le y \le 0.450$, $0.045 \le z \le 0.450$, $0.450 \le x+y+z \le 0.500$, and $0.980 \le a \le 1.020$.

27 Claims, 15 Drawing Sheets

(51) Int. Cl.
*H01L 41/083* (2006.01)
*H01L 41/257* (2013.01)
*H01L 41/273* (2013.01)

(56) References Cited

U.S. PATENT DOCUMENTS

| | | | | |
|---|---|---|---|---|
| 2003/0001131 A1* | 1/2003 | Takase | ............... | H01L 41/1878 252/62.9 R |
| 2009/0102325 A1* | 4/2009 | Ozawa | ............... | C01G 23/003 310/358 |
| 2009/0189489 A1* | 7/2009 | Yura | ............... | C01G 23/003 310/358 |
| 2010/0019624 A1* | 1/2010 | Kaigawa | ............... | C04B 35/495 310/358 |
| 2011/0215679 A1* | 9/2011 | Naono | ............... | B41J 2/14233 310/360 |
| 2011/0268965 A1 | 11/2011 | Kubota et al. | | |
| 2013/0056671 A1 | 3/2013 | Kubota et al. | | |
| 2013/0270965 A1 | 10/2013 | Hayashi et al. | | |
| 2013/0330541 A1 | 12/2013 | Kubota et al. | | |

OTHER PUBLICATIONS

Changrong Zhou et al., "Structure and Piezoelectric Properties of $Bi_{0.5}Na_{0.5}TiO_3$—$Bi_{0.5}K_{0.5}TiO_3$—$BiFeO_3$ Lead-Free Piezoelectric Ceramics," 114(2-3) Mater. Chem. Phys. 832-836 (Apr. 2009).

* cited by examiner

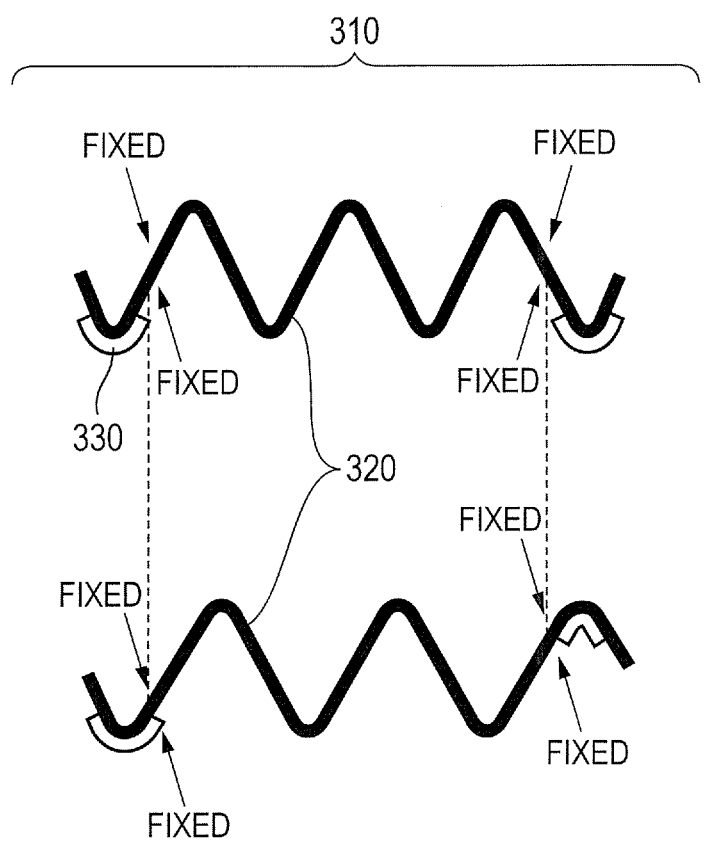
FIG. 11A IN PHASE
FIG. 11B REVERSED PHASE

PIEZOELECTRIC MATERIAL, PIEZOELECTRIC ELEMENT, MULTILAYERED PIEZOELECTRIC ELEMENT, LIQUID EJECTION HEAD, LIQUID EJECTION APPARATUS, ULTRASONIC MOTOR, OPTICAL EQUIPMENT, VIBRATION APPARATUS, DUST REMOVING APPARATUS, IMAGING APPARATUS, AND ELECTRONIC EQUIPMENT

BACKGROUND OF THE INVENTION

1. Field of the Invention

The present invention relates to a piezoelectric material, and more particularly, to a lead-free piezoelectric material and a production method therefor. The present invention also relates to a piezoelectric element using the piezoelectric material, a multilayered piezoelectric element, a liquid ejection head, a liquid ejection apparatus, an ultrasonic motor, an optical equipment, a vibration apparatus, a dust removing apparatus, an imaging apparatus, and an electronic equipment.

2. Description of the Related Art

A commonly used piezoelectric material is an $ABO_3$ perovskite-type metal oxide such as lead titanate zirconate (hereinafter referred to as "PZT"). However, PZT contains lead at an A-site of a perovskite skeleton. Accordingly, an effect of a lead component on environments has been seen as a problem. In order to deal with this problem, a piezoelectric material and a piezoelectric element using a lead-free perovskite-type metal oxide have been proposed.

For example, as a piezoelectric material formed of a lead-free perovskite-type oxide, Japanese Patent Publication No. H04-60073 discloses a $Bi_{0.5}Na_{0.5}TiO_3$—$BaTiO_3$ based or $Bi_{0.5}Na_{0.5}TiO_3$—$Bi_{0.5}K_{0.5}TiO_3$ based piezoelectric ceramics. Those materials have a problem in that they have a depolarization temperature of 140° C. or less at which a piezoelectric function is lost.

As another example, Japanese Patent No. 4510966 discloses a $Bi_{0.5}Na_{0.5}TiO_3$—$Bi_{0.5}K_{0.5}TiO_3$—$BaTiO_3$ based piezoelectric ceramics having a piezoelectric constant $d_{33}$ of 100 pC/N or more and having a decrease rate of the piezoelectric constant $d_{33}$ of 15% or less in a high temperature storage test of 150° C. The maximum piezoelectric constant $d_{33}$ of those materials when a decrease rate thereof is 15% or less is 134 pC/N.

As still another example, "Materials Chemistry and Physics" 2009, Vol. 114, pp. 832-836 discloses a $Bi_{0.5}Na_{0.5}TiO_3$—$Bi_{0.5}K_{0.5}TiO_3$—$BiFeO_3$ based piezoelectric ceramics. The maximum piezoelectric constant $d_{33}$ of this material is as large as 170 pC/N or more, but this material has a problem of a low electric insulation property because Fe is excessively dissolved in solid.

SUMMARY OF THE INVENTION

The present invention has been accomplished so as to solve the above-mentioned problems, and is directed to providing a lead-free piezoelectric material having a satisfactory and stable piezoelectric constant and electric insulation property in a wide practical temperature range.

Further, the present invention is directed to providing a piezoelectric element using the piezoelectric material, a multilayered piezoelectric element, a liquid ejection head, a liquid ejection apparatus, an ultrasonic motor, an optical equipment, a vibration apparatus, a dust removing apparatus, an imaging apparatus, and an electronic equipment.

A piezoelectric material according to one aspect of the present invention includes a perovskite-type metal oxide represented by the following general formula (1) as a main component, the piezoelectric material containing Mn in a content of 0.01 part by weight or more and 0.80 part by weight or less with respect to 100 parts by weight of the perovskite-type metal oxide:

$$(Li_{\alpha x}Na_{\alpha y}K_{\alpha z}Ba_\beta Bi_{0.5\alpha+\gamma})_a(Ti_{\alpha+\beta}Fe_\gamma)O_3 \qquad (1)$$ 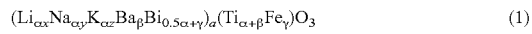

where $0.800 \leq \alpha \leq 0.999$, $0 \leq \beta \leq 0.150$, $0.001 \leq \gamma \leq 0.050$, $\alpha+\beta+\gamma=1$, $0 \leq x \leq 0.050$, $0.045 \leq y \leq 0.450$, $0.045 \leq z \leq 0.450$, $0.450 \leq x+y+z \leq 0.500$, and $0.980 \leq a \leq 1.020$.

A piezoelectric element according to another aspect of the present invention includes at least a first electrode, a piezoelectric material portion, and a second electrode, in which the piezoelectric material portion is formed of the above-mentioned piezoelectric material.

A multilayered piezoelectric element according to one aspect of the present invention includes two or more piezoelectric material layers and two or more electrode layers including one or more internal, electrode, which are laminated alternately, in which the piezoelectric material layer is formed of the above-mentioned piezoelectric material.

A liquid ejection head according to one aspect of the present invention includes at least: a liquid chamber including a vibration portion containing the above-mentioned piezoelectric element or the above-mentioned multilayered piezoelectric element; and an ejection orifice communicating with the liquid chamber.

A liquid ejection apparatus according to one aspect of the present invention includes: a stage configured to receive an object; and the above-mentioned liquid ejection head.

An ultrasonic motor according to one aspect of the present invention includes at least: a vibrating body containing the above-mentioned piezoelectric element or the above-mentioned multilayered piezoelectric element; and a rotor which comes into contact with the vibrating body.

An optical equipment according to one aspect of the present invention includes a drive unit including the above-mentioned ultrasonic motor.

A vibration apparatus according to one aspect of the present invention includes a vibrating body containing a diaphragm and the above-mentioned piezoelectric element or the above-mentioned multilayered piezoelectric element disposed on the diaphragm.

A dust removing apparatus according to one aspect of the present invention includes a vibration portion including the above-mentioned vibration apparatus.

An imaging apparatus according to one aspect of the present invention includes at least: the above-mentioned dust removing apparatus; and an imaging element unit, in which the dust removing apparatus includes the diaphragm provided on a light receiving surface of the imaging element unit.

An electronic equipment according to one aspect of the present invention includes a piezoelectric acoustic component including the above-mentioned piezoelectric element or the above-mentioned multilayered piezoelectric element.

Further features of the present invention will become apparent from the following description of exemplary embodiments with reference to the attached drawings.

According to the present invention, it is possible to provide the lead-free piezoelectric material having a satisfactory and stable piezoelectric constant and electric insulation property in a wide practical temperature range.

BRIEF DESCRIPTION OF THE DRAWINGS

FIGS. 11A and 11B are schematic diagrams each illustrating a vibration principle of the dust removing apparatus of the present invention.

DESCRIPTION OF THE EMBODIMENTS

Figure 1:
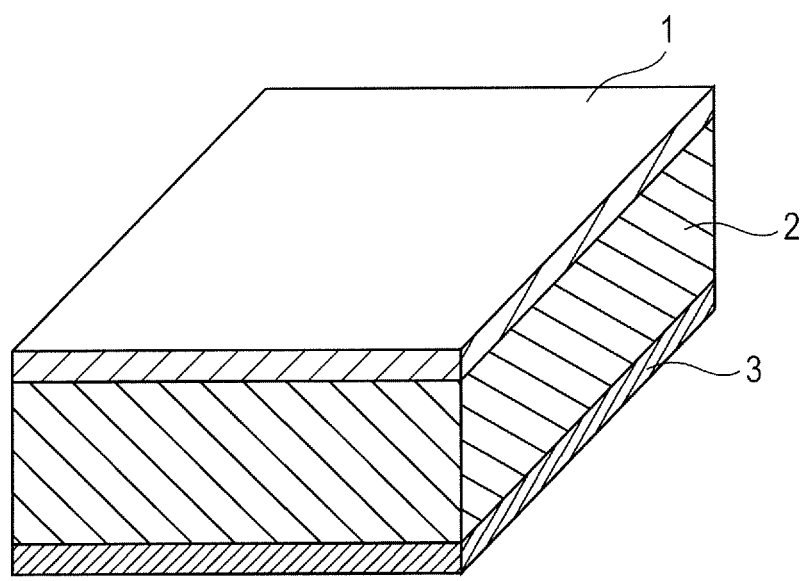
FIG. 1 is a schematic view illustrating a configuration of a piezoelectric element according to an embodiment of the present invention.

Exemplary embodiments of the present invention are described below.

A piezoelectric material according to the present invention includes a perovskite-type metal oxide represented by the following general formula (1) as a main component, the piezoelectric material containing Mn in a content of 0.01 part by weight or more and 0.80 part by weight or less with respect to 100 parts by weight of the perovskite-type metal oxide:

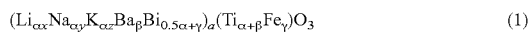

$(Li_{\alpha x}Na_{\alpha y}K_{\alpha z}Ba_{\beta}Bi_{0.5\alpha+\gamma})_a(Ti_{\alpha+\beta}Fe_{\gamma})O_3$   (1)

where $0.800 \leq \alpha \leq 0.999$, $0 \leq \beta \leq 0.150$, $0.001 \leq \gamma \leq 0.050$, $\alpha+\beta+\gamma=1$, $0 \leq x \leq 0.050$, $0.045 \leq y \leq 0.450$, $0.045 \leq z \leq 0.450$, $0.450 \leq x+y+z \leq 0.500$, and $0.980 \leq a \leq 1.020$.

(Regarding Perovskite-Type Metal Oxide)

The perovskite-type metal oxide of the present invention refers to a metal oxide having a perovskite structure that is ideally a cubic structure as described in "Iwanami. Dictionary of Physics and Chemistry", Fifth Edition (Iwanami Shoten, published on Feb. 20, 1998). The metal oxide having a perovskite structure is generally represented by a chemical formula of $ABO_3$. In the perovskite-type metal oxide, the elements A and B occupy specific positions in a form of ions in a unit cell, which are called A-site and B-site. For example, in a cubic unit cell, the element A is positioned at a vertex of the cube while the element B occupies the body-centered position of the cube. The element O occupies a face center position as an anion of oxygen.

In the metal oxide represented by the above-mentioned general formula (1), metal elements positioned in an A-site are Li, Na, K, Ba, and Bi (note that, Li and Ba may not be present), and metal elements positioned in a B-site are Ti and Fe. A part of Li, Na, K, Ba, and Bi may be positioned in the B-site. Similarly, a part of Ti and Fe may be present in the A-site. Further, the piezoelectric material of the present invention may contain Ca and Sr to such a degree that Ca and Sr are contained in a Ba raw material and contain Zr, Hf, Sn, and Nb to such a degree that Zr, Hf, Sn, and Nb are contained in a Ti raw material.

In the general formula (1), a molar ratio between the elements positioned in the B-site and the O elements is expressed as 1:3. However, even if the element content ratio is shifted slightly (for example, 1.00:2.94 to 1.00:3.06), as long as the metal oxide has the perovskite structure as a main phase, such metal oxide is included within the scope of the present invention.

It can be determined by structure analysis, for example, through use of X-ray diffraction or electron beam diffraction that the metal oxide has a perovskite structure.

(Regarding Form of Piezoelectric Material)

The form of the piezoelectric material according to the present invention is not limited and may be any one of ceramics, powder, a single-crystal, a film, a slurry, and the like. In particular, it is preferred that the piezoelectric material be ceramics. The term "ceramics" as used herein refers to an aggregate (also referred to as "bulk body") of crystal grains, a so-called polycrystal, which contains a metal oxide as a basic component and is baked by a heat treatment. The ceramics include ones processed after sintering.

(Main Component of Piezoelectric Material of Present Invention)

The metal oxide represented by the general formula (1) is a solid solution, and hence each metal component cannot be separated. But the metal oxide can be considered as a solid solution of bismuth sodium titanate (hereinafter referred to as "BNT"), bismuth potassium titanate (hereinafter referred to as "BKT"), bismuth lithium titanate (hereinafter referred to as "BLT"), barium titanate (hereinafter referred to as "BTO"), and bismuth ferrite (hereinafter referred to as "BFO"). When an excess degree and a lack degree of each metal component in each site of a perovskite-type metal oxide are abbreviated and expressed for purpose of description, the metal oxide of the general formula (1) is rewritten to $2\alpha(xBLT-yBNT-zBKT)-\beta BTO-\gamma BFO$.

Herein, "$\alpha$", "$\beta$", and "$\gamma$" respectively represent molar ratios of xBLT-yBNT-zBKT, BTO, and BFO in the metal oxide. A relationship of $\alpha+\beta+\gamma=1$ is satisfied.

In the present invention, the range of "α" is 0.800≤α≤0.999. When "α" is less than 0.800, the content of a BTO-BFO component becomes too large, which degrades ferroelectricity and an insulation property, with the result that the polarization treatment of a piezoelectric material becomes difficult. On the other hand, when "α" is more than 0.999, the content of a BLT-BNT-BKT component becomes too large, which decreases piezoelectric performance and depolarization temperature. In the present invention, the range of "α" is more preferably 0.850≤α≤0.950, still more preferably 0.900≤α≤0.940.

The depolarization temperature (also represented by $T_d$) as used herein refers to temperature at which, when temperature is raised from room temperature to temperature $T_d$ (°C.) after the elapse of sufficient time from the polarization treatment and lowered to room temperature again, a piezoelectric constant becomes smaller than that before the temperature is raised. Herein, the temperature at which the piezoelectric constant becomes less than 70% of that before the temperature is raised is referred to as "depolarization temperature $T_d$".

In the present invention, the range of "β" is 0≤β≤0.150. When "β" is more than 0.150, the piezoelectric performance is degraded. In the present invention, the range of "β" is more preferably 0≤β≤0.100, still more preferably 0.030≤β≤0.070.

In the present invention, the range of "γ" is 0.001≤γ≤0.050. When "γ" is less than 0.001, the effect of enhancing the piezoelectric performance by BFO solid solution is not obtained. On the other hand, when "γ" is more than 0.050, the content of a BFO component becomes too large, which decreases depolarization temperature and insulation performance. In the present invention, the range of "γ" is more preferably 0.002≤γ≤0.020. It is preferred that "γ" be 0.002 or more because the effect of enhancing piezoelectric performance increases. On the other hand, it is preferred that "γ" be 0.020 or less because the effect of enhancing piezoelectric performance increases and an insulation property is also enhanced relatively.

In the above-mentioned general formula, "x", "y", and "z" respectively represent molar ratios of BLT, BNT, and BKT in the metal oxide. The total value of "x", "y", and "z" satisfies a relationship: 0.450≤x+y+z≤0.500. That x+y+z is 0.500 shows that the total content of Li, Na, and K is contained in a BLT-BNT-BKT solid solution in accordance with a stoichiometric mixture ratio. This is an ideal state, and it is preferred that x+y+z be close to 0.500. Note that, when x+y+z is more than 0.500, the piezoelectric performance is degraded. On the other hand, that x+y+z is 0.450 shows that the total content of Li, Na, and K is contained in a BLT-BNT-BKT solid solution by 90% of a stoichiometric mixture ratio. When x+y+z is less than 0.450, the piezoelectric performance is greatly degraded.

In the present invention, the range of "x" is 0≤x≤0.050. When "x" is more than 0.050, the content of a BLT component becomes too large, which degrades ferroelectricity and an insulation property, with the result that the polarization treatment of a piezoelectric material becomes difficult. In the present invention, the range of "x" is more preferably 0≤x≤0.035, still more preferably 0.010≤x≤0.025.

In the present invention, the range of "y" is 0.045≤x≤0.450. When "y" is less than 0.045, the content of a BLT-BKT-BFO component becomes too large, which degrades ferroelectricity, with the result that the polarization treatment of a piezoelectric material becomes difficult. On the other hand, when "y" is more than 0.450, depolarization temperature is decreased. In the present invention, the range of "y" is more preferably 0.225≤x≤0.450, still more preferably 0.350≤x≤0.450.

In the present invention, the range of "z" is 0.045≤x≤0.450. When "z" is less than 0.045, the content of a BLT-BNT-BFO component becomes too large, which decreases depolarization temperature. On the other hand, when "z" is more than 0.450, a BLT-BKT-BFO component becomes too large, which degrades ferroelectricity, with the result that the polarization treatment of a piezoelectric material becomes difficult. In the present invention, the range of "z" is more preferably 0.045≤x≤0.250, still more preferably 0.045≤x≤0.150.

In the present invention, it is preferred that "α", "β", "x", "y", and "z" satisfy the following relationship: 2αy+β≥2α(x+z). This means that the metal oxide of the general formula (1) contains a BNT-BTO component in an equal content or more of a BLT-BKT component. When 2αy+β≥2α(x+z) is satisfied, high piezoelectric performance can be obtained while high depolarization temperature is kept. It is more preferred that the relationship of 2αy+β≥4.6α(x+z) be satisfied.

In the general formula (1), "a" representing a molar ratio between the abundance of Li, Na, K, Ba, and Bi (note that, Li and Ba may not be present) in the A-site and the abundance of Ti and Fe in the B-site is in a range of 0.980≤a≤1.020. When "a" is less than 0.980, abnormal grain growth is likely to occur, and the mechanical strength of a material may be degraded. On the other hand, when "a" is more than 1.020, the temperature required for grain growth becomes too high, with the result that sintering cannot be performed in a general calcination furnace. Herein, "sintering cannot be performed" refers to that the density does not become a sufficient value and a great number of pores and defects are present in the piezoelectric material. It is more preferred that the relationship of 0.990≤a≤1.010 be satisfied.

A method of measuring a composition of the metal oxide represented by the general formula (1) is not particularly limited. As the method of measuring a composition, there are given X-ray fluorescence (XRF) analysis, inductively coupled plasma (ICP) emission spectrochemical analysis, and atomic absorption analysis. In any method, a weight ratio and a composition ratio of each element contained in the piezoelectric material can be calculated. However, it is preferred to use atomic absorption analysis for a molar ratio of Li, Na, and K.

In the present invention, the content of Mn in the piezoelectric material is 0.01 part by weight or more and 0.80 part by weight or less in terms of a metal with respect to 100 parts by weight of the metal oxide. When the piezoelectric material of the present invention contains Mn in the above-mentioned range, an insulation property and a mechanical quality factor are enhanced. Herein, the mechanical quality factor refers to a factor representing elasticity loss caused by vibration when a piezoelectric material is evaluated as a vibrator, and the magnitude of the mechanical quality factor is observed as acuteness of a resonance curve in impedance measurement. That is, the mechanical quality factor is a constant representing the acuteness of resonance of a vibrator. When the insulation property and mechanical quality factor are enhanced, in the case where the piezoelectric material is driven as a piezoelectric element by applying a voltage thereto, the long-term reliability of the piezoelectric element can be ensured.

The content of Mn "in terms of a metal" refers to a value determined by a ratio of the weight of Mn with respect to the total weight of Li, Na, K, Bi, Ba, Ti, Fe, and Mn in the case of converting elements forming the metal oxide represented by the general formula (1) in terms of an oxide from the content of each metal of Li, Na, K, Bi, Ba, Ti, Fe, and Mn measured by XRF analysis, ICP emission spectrochemical analysis, or atomic absorption analysis from the piezoelectric material and setting the total weight thereof to 100.

When the content of Mn is less than 0.01 part by weight, the insulation property is degraded. On the other hand, when the content of Mn is more than 0.80 part by weight, the piezoelectric performance is degraded. The content of Mn is more preferably in a range of 0.07 part by weight or more and 0.50 part by weight or less, still more preferably in a range of 0.10 part by weight or more and 0.40 part by weight or less.

It is preferred that a part or a whole of the above-mentioned Mn be present in the B-site of the perovskite-type metal oxide represented by the general formula (1). Mn can generally take a valence of 4+, 2+, or 3+. In the case where conduction electrons are present in crystals (for example, in the case where oxygen defects are present in crystals, the case where donor elements occupy the A-site, etc.), the valence of Mn decreases from 4+ to 3+ or 2+, and hence the conduction electrons are trapped to enhance insulation resistance. From the viewpoint of an ion radius, Mn having a valence of 4+ can be easily substituted for Ti which is a main component in the B-site. On the other hand, Mn having a valence of 2+ serves as an acceptor. Mn serving as an acceptor is contained in a crystal lattice of a perovskite-type metal oxide, holes are formed in crystals, or oxygen vacancy is formed in crystals. When the valence of Mn is 2+ or 3+, holes may not be compensated only by the introduction of oxygen vacancy, with the result that insulation resistance decreases. Thus, it is preferred that a most part of Mn contained in the piezoelectric material of the present invention be 4+. Note that, a trace amount of Mn may have a valence lower than 4+ and may form oxygen vacancy as an acceptor. When Mn having a valence of 2+ or 3+ and oxygen vacancy form a defect dipole, the mechanical quality factor of the piezoelectric material is enhanced.

The piezoelectric material according to an embodiment of the present invention may contain components (hereinafter referred to as "accessory components") other than the general formula (1) and Mn to such a degree that the characteristics are not degraded or that the characteristics can be adjusted in a range causing no problem to practical use. It is preferred that the total of the accessory components be 1.2 parts by weight or less with respect to 100 parts by weight of the metal oxide represented by the general formula (1). When the content of the accessory components is more than 1.2 parts by weight, there is a risk in that the piezoelectric characteristics and insulation characteristics of the piezoelectric material may be degraded. Further, the content of metal elements other than Li, Na, K, Bi, Ba, Ti, Fe, and Mn in the accessory components is preferably 1.0 part by weight or less in terms of an oxide or 0.9 part by weight or less in terms of a metal with respect to the piezoelectric material. The "metal element" as used herein also includes semimetal elements such as Si, Ge, and Sb. When the content of metal elements other than Li, Na, K, Bi, Ba, Ti, Fe, and Mn in the accessory components is more than 1.0 part by weight in terms of an oxide or more than 0.9 part by weight in terms of a metal with respect to the piezoelectric material, there is a risk in that the piezoelectric characteristics and insulation characteristics of the piezoelectric material may be remarkably degraded.

Examples of the accessory components which can be used for adjusting the characteristics in accordance with the application of the piezoelectric material of the present invention include Ca, Sr, Mg, Y, Zr, Al, Mo, and Nb. It is appropriate that those accessory components are contained in a piezoelectric material in an oxidized form in the same way as in metal components contained in the general formula (1). Those accessory components may be dissolved in solid in the perovskite-type metal oxide of the general formula (1) or may be mixed with the metal oxide as another metal oxide. Of the accessory components, Ca, Mg, Y, Zr, Al, Mo, and Nb have the effect of enhancing the piezoelectric performance of the piezoelectric material of the present invention. Sr and Mg have the effect of enhancing the mechanical quality factor of the piezoelectric material of the present invention.

A method of measuring parts by weight of the accessory components is not particularly limited. As the method, there are given XRF analysis, ICP emission spectrochemical analysis, and atomic absorption analysis.

(Regarding Depolarization Temperature)

In order for the piezoelectric material of the present invention to prevent the piezoelectric performance from being degraded due to heating during a device production step or heat generation caused by device drive, it is preferred to select a composition of the material so that the depolarization temperature of the piezoelectric material of the present invention is 140° C. or more, preferably 145° C. or more, still more preferably 150° C. or more. The depolarization temperature of the piezoelectric material of the present invention can be controlled by the composition parameters $\alpha$, $\beta$, $\gamma$, x, y, z and the content of Mn, or the crystallinity and the composition uniformity on a micro scale of the piezoelectric material.

(Regarding Particle Diameter and Equivalent Circle Diameter of Crystal Grain)

It is preferred that an average equivalent circle diameter of crystal grains forming the piezoelectric material according to the present invention be 0.3 µm or more and 10 µm or less. By setting the average equivalent circle diameter of crystal grains in this range, the piezoelectric material of the present invention can have satisfactory piezoelectric characteristics and mechanical strength. When the average equivalent circle diameter is less than 0.3 µm, there is a risk in that the piezoelectric characteristics may not be sufficient. On the other hand, when the average equivalent circle diameter is more than 10 µm, there is a risk in that the mechanical strength may be degraded. The average equivalent circle diameter is more preferably in a range of 1 µm or more and 5 µm or less.

In the piezoelectric material according to the present invention, it is preferred that the crystal grains forming the piezoelectric material contain 99 number percentage or more of crystal grains having an equivalent circle diameter of 25 µm or less. By setting the number percentage of the crystal grains having an equivalent circle diameter of 25 µm or less in this range, the piezoelectric material of the present invention can have satisfactory mechanical strength. The mechanical strength has a strong negative correlation with the content ratio of crystal grains having a large equivalent circle diameter. When the number percentage of the crystal grains is less than 99, the content ratio of particles having an equivalent circle diameter of more than 25 µm becomes large, with the result that there is a risk in that the mechanical strength may be degraded.

The piezoelectric material according to the present invention may contain needle-like crystals having a long side of more than 25 µm. Even in this case, it is preferred that the piezoelectric material contain 99 number percentage or more of crystal grains having an equivalent circle diameter of 25 µm or less.

The "equivalent circular diameter" used herein refers to a "projected area equivalent circular diameter" that is generally mentioned in a microscopic observation method and indicates a diameter of a perfect circle having the same area as a projected area of the crystal grain. In the present invention, the method of measuring the equivalent circular diameter is not limited particularly. For example, the equivalent circular diameter can be determined by photographing a surface of the piezoelectric material using a polarizing microscope or a scanning electron microscope, and by performing image processing on the obtained photographic image. The optimum magnification varies depending on the particle diameter to be observed, and hence an optical microscope or an electron microscope may be used appropriately. An equivalent circle diameter may be determined from an image of a polished surface or a cross-section instead of a surface of a material.

(Regarding Relative Density)

The relative density of the piezoelectric material of the present invention is preferably 93% or more and 100% or less.

The relative density refers to a ratio of an actually measured density with respect to a theoretical density calculated from a lattice constant of the piezoelectric material and an atomic weight of a constituent element of the piezoelectric material. The lattice constant can be measured by, for example, X-ray diffraction analysis. The density can be measured by, for example, an Archimedes method.

When the relative density is less than 93%, there is a risk in that the piezoelectric characteristics and the mechanical quality factor may not be sufficient and the insulation property may be degraded.

The lower limit of the relative density is more preferably 94% or more, more preferably 95% or more.

(Production Method for Piezoelectric Material, of the Present Invention)

A production method for a piezoelectric material according to the present invention is not limited particularly.

(Raw Material for Piezoelectric Material)

In the case of producing a piezoelectric material of the present invention, a general solid-phase sintering method of sintering a raw material mixture such as an oxide, a carbonate, a nitrate, or an oxalate containing an intended constituent element under ordinary pressure can be adopted. A raw material having high purity is preferably used. As the raw material, a metal oxide, metal salt powder, and a liquid forming a piezoelectric material can be used. In addition, as the material, there may be used perovskite-type metal oxide powder such as BLT powder, BNT powder, BKT powder, BTO powder, or BFO powder. A Mn compound that may be used is, for example, manganese carbonate, manganese oxide, manganese dioxide, manganese acetate, or trimanganese tetraoxide.

Further, the raw material for adjusting "a" exhibiting the molar ratio between the abundance of Li, Na, K, Bi, Ba in the A-site of the piezoelectric material according to the present invention and the abundance of Ti and Fe in the B-site thereof is not particularly limited. Any of a Li compound, a Na compound, a K compound, a Bi compound, a Ba compound, a Ti compound, and a Fe compound has the same effect.

(Granulated Powder and Compact)

In the case of forming the piezoelectric material of the present invention into a ceramics (sintered body), a compact before being calcined fired needs to be formed. The compact refers to a solid substance formed from raw material powder.

As a forming method, there may be given uniaxial pressing, cold isostatic pressing, hot isostatic pressing, slip casting, and extrusion molding. When a compact is produced, it is preferred to use granulated powder. When the compact using the granulated powder is sintered, there is an advantage in that the size distribution of crystal grains of the sintered body is likely to be uniform.

No particular limitation is imposed on a method of granulating raw material powder of a piezoelectric material, and a spray drying method is the most preferred granulation method from such a viewpoint that the grain size of the granulated powder can be made more uniform.

Examples of the binder that may be used for granulation include polyvinyl alcohol (PVA), polyvinyl butyral (PVB), and an acrylic resin. The amount of the binder to be added is, with respect to the raw material power of the piezoelectric material, preferably 1 part by weight to 10 parts by weight, more preferably 2 parts by weight to 5 parts by weight from the viewpoint of increasing the density of a compact.

(Sintering)

No particular limitation is imposed on a method of sintering the compact. Examples of the sintering method include sintering using an electric furnace, sintering using a gas furnace, a conduction heating method, a microwave sintering method, a millimeter-wave sintering method, and hot isostatic pressing (HIP). The electric furnace and gas furnace for the sintering may be a continuous furnace or a batch furnace.

Although no particular limitation is imposed on the sintering temperature, by virtue of an effect obtained by containing BFO as the component, the piezoelectric material of the present invention can obtain sufficient piezoelectricity in a low-temperature process. The piezoelectric material of the present invention forms piezoelectric ceramics having sufficient density and piezoelectric performance at a sintering temperature of about 1,100° C. to 1,200° C. When the sintering temperature is less than 1,100° C., there is a risk in that the particle diameter of the ceramics to be obtained may become small, and the piezoelectric performance may be degraded. On the other hand, when the sintering temperature is more than 1,200° C., there is a risk in that the particle diameter of the ceramics to be obtained may become excessively large, and the mechanical strength may be degraded.

In order to stabilize the properties of a piezoelectric material obtained by the sintering treatment with good reproducibility, it is appropriate that the sintering treatment is performed for 2 hours or more to 48 hours or less with the sintering temperature being set constant in the above-mentioned range. Further, a sintering method such as a two-step sintering method may be used, and a method in which temperature does not change suddenly is preferred in consideration of the productivity.

It is preferred that the piezoelectric material obtained by the sintering treatment be subjected to a heat treatment at a temperature equal to or higher than the Curie temperature after being polished. When the piezoelectric material is mechanically polished, a residual stress is generated inside the piezoelectric material. However, when the piezoelectric material is subjected to a heat treatment at the Curie temperature or more, the residual stress is relieved, and the piezoelectric property of the piezoelectric material becomes more satisfactory. Although the heat: treatment time is not particularly limited, 1 hour or more is preferred.

When the piezoelectric material of the present invention is used as a film formed on a substrate, it is desired that the thickness of the piezoelectric material be 200 nm or more to 10 µm or less, more preferably 300 nm or more to 3 µm or less. This is because, when the film thickness of the piezoelectric material is 200 nm or more to 10 µm or less, a sufficient electromechanical transduction performance as a piezoelectric element may be obtained.

A method of stacking the above-mentioned film is not particularly limited. For example, there are given chemical solution deposition (CSD), a sol-gel process, metalorganic chemical vapor deposition (MOCVD), sputtering, pulse laser deposition (PLD), hydrothermal synthesis, and aerosol deposition (AD). Of those, chemical solution deposition or sputtering is the most preferred stacking method. By chemical solution deposition or sputtering, the area of a film formed may be increased with ease.

It is preferred that the substrate used for the piezoelectric material of the present invention be a single-crystal substrate cut and polished along a (001) plane or a (110) plane. With the use of a single-crystal substrate cut and polished along a specific crystal plane, a piezoelectric material film formed on the surface of the substrate may also be strongly oriented in the same direction.

(Regarding Electrode)

FIG. 1 is a schematic view illustrating a configuration of a piezoelectric element according to an embodiment of the present invention. The piezoelectric element according to the present invention is a piezoelectric element including at least a first electrode 1, a piezoelectric material 2, and a second electrode 3, in which the piezoelectric material 2 is the piezoelectric material of the present invention.

The polarization treatment and piezoelectric drive of the piezoelectric material according to the present invention can be performed by forming the piezoelectric element including at least the first electrode and the second electrode. The first electrode and the second electrode are each formed of a conductive layer having a thickness of about 5 nm to 2,000 nm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu, and compounds thereof.

Each of the first electrode and the second electrode may be formed of one kind of those materials, or may be obtained by stacking two or more kinds thereof. The first electrode and the second electrode may be formed of different materials, respectively.

A production method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

(Regarding Polarization Treatment)

It is more preferred that the piezoelectric element have polarization axes oriented in a certain direction. When the polarization axes are oriented in a certain direction, the piezoelectric constant of the piezoelectric element increases.

A polarization method for the piezoelectric element is not particularly limited. The polarization treatment may be performed in the air or may be performed in silicone oil. A temperature at which the polarization is performed is preferably a temperature of 60° C. to 150° C. However, an optimum condition slightly varies depending on the composition of a piezoelectric material constituting the element. An electric field to be applied for performing the polarization treatment is preferably 1.0 kV/mm to 7.0 kV/mm, more preferably 2.0 kV/mm to 6.0 kV/mm.

(Measurement of Piezoelectric Constant and Mechanical Quality Factor)

The piezoelectric constant and mechanical quality factor of the piezoelectric element may be determined by calculation, from the measurement results of a resonance frequency and an antiresonance frequency, which are obtained with a commercially available impedance analyzer, based on the standard of Japan Electronics and Information Technology Industries Association (JEITA EM-4501). This method is hereinafter referred to as resonance-antiresonance method.

(Structure of Multilayered Piezoelectric Element)

Next, a multilayered piezoelectric element using the piezoelectric material of the present invention is described.

The multilayered piezoelectric element according to the present invention is a multilayered piezoelectric element including piezoelectric material layers and electrode layers including at least one internal electrode, which are stacked alternately, in which the piezoelectric material layers contain the piezoelectric material of the present invention. In the multilayered piezoelectric element, piezoelectric materials between electrodes are thin, and hence the multilayered piezoelectric element is required to have durability with respect to a high electric field. Thus, the piezoelectric material according to the present invention is particularly excellent in insulation resistance, and hence can be used preferably for a multilayered piezoelectric element.

Figure 2A:
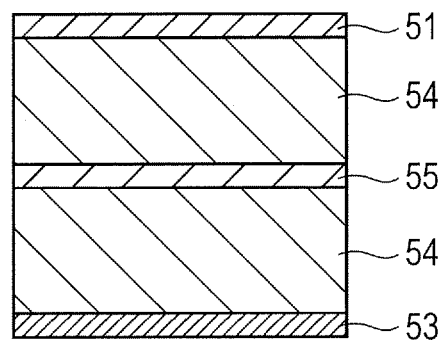
FIGS. 2A and 2B are schematic sectional views each illustrating a configuration of a multilayered piezoelectric element according to an embodiment of the present invention.

FIGS. 2A and 2E are schematic sectional views each illustrating a configuration of a multilayered piezoelectric element according to an embodiment of the present invention. The multilayered piezoelectric element according to the present invention is a multilayered piezoelectric element including piezoelectric material layers 54 and electrode layers including an internal electrode 55, the piezoelectric material layers and the electrode layers being stacked alternately, in which the piezoelectric material layers 54 are formed of the above-mentioned piezoelectric material. The electrodes may include external electrodes such as a first electrode 51 and a second electrode 53 in addition to the internal electrode 55.

Figure 2B:
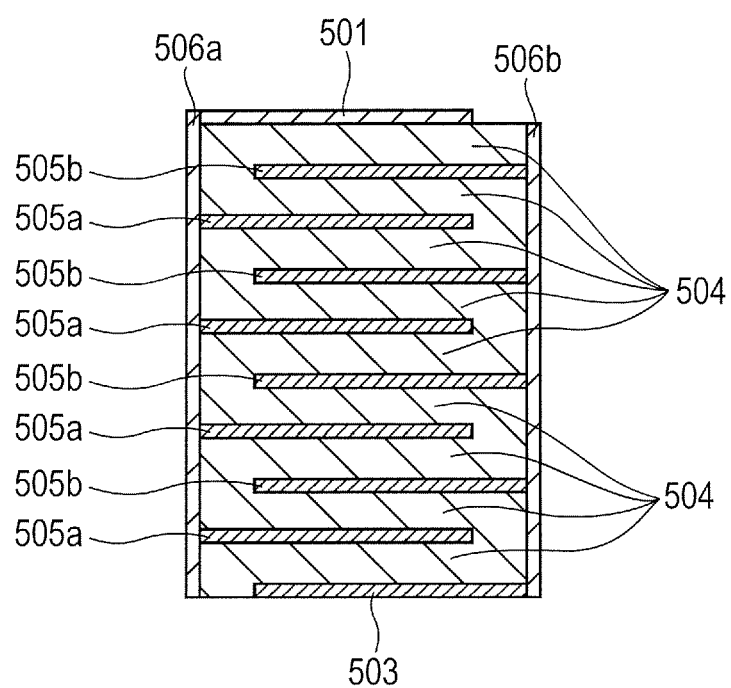

FIG. 2A illustrates the configuration of a multilayered piezoelectric element of the present invention in which the piezoelectric material layers 54 of two layers and the internal electrode 55 of one layer are stacked alternately, and the multilayered structure is sandwiched between the first electrode 51 and the second electrode 53. However, as illustrated in FIG. 2B, the number of piezoelectric material layers and internal electrodes may be increased, and the number of the layers is not limited. The multilayered piezoelectric element of FIG. 2B has such a configuration that piezoelectric material layers 504 of nine layers and internal, electrodes 505 (505a and 505b) of eight layers are stacked alternately, and the multilayered structure is sandwiched between a first electrode 501 and a second electrode 503, and has an external electrode 506a and an external electrode 506b for short-circuiting the alternately formed internal electrodes.

The internal electrodes 55, 505 and the external electrodes 506a, 506b do not need to be identical in size and shape to the piezoelectric material layers 504, and may be divided into multiple portions.

The internal electrodes 55, 505, the external electrodes 506a, 506b, the first electrodes 51 and 501, and the second electrodes 53 and 503 are formed of a conductive layer having a thickness of about 5 nm to 10,000 nm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu and compounds thereof. The internal electrodes 55, 505, the external electrodes 506a, 506b, the first electrodes 51 and 501, and the second electrodes 53 and 503 may be formed of one kind thereof, may be formed of a mixture or alloy of two or more kinds thereof, or may be formed of a multilayered body of two or more kinds thereof. Further, multiple electrodes may be respectively formed of materials different from each other.

In the multilayered piezoelectric element of the present invention, the internal electrode 55, 505 contains Ag and Pd, and a weight ratio M1/M2 between the containing weight M1 of Ag and the containing weight M2 of Pd is preferably $0.25 \leq M1/M2 \leq 4.0$, more preferably $0.3 \leq M1/M2 \leq 3.0$. A case where the weight ratio M1/M2 is less than 0.25 is not desired because the sintering temperature of the internal electrode increases. On the other hand, a case where the weight ratio M1/M2 is more than 4.0 is not desired because the internal electrode becomes island-shaped, resulting in in-plane non-uniformity. In view of the reduction of the cost of the electrode material, it is preferred that the internal electrodes 55, 505 contain at least one kind of Ni and Cu. When at least one kind of Ni and Cu is used for the internal electrodes 55, 505, the multilayered piezoelectric element according to the present invention can be calcined in a reducing atmosphere. As illustrated in FIG. 2B, multiple electrodes including the internal electrodes 505 may be short-circuited to each other for the purpose of making the phase of a driving voltage uniform. For example, the internal electrodes 505a may be short-circuited to the first electrode 501 by using the external electrode 506a. The internal electrodes 505b may be short-circuited to the second electrode 503 by using the external electrode 506b. Further, a mode in which the electrodes are short-circuited to each other is not limited. An electrode or wiring for short-circuit may be provided on a side surface of the multilayered piezoelectric element. Alternatively, the electrodes may be short-circuited to each other by providing a through-hole passing through the piezoelectric material layers 504 and providing a conductive material inside the through hole.

(Liquid Ejection Head)

A liquid ejection head according to the present invention includes at least: a liquid chamber including a vibration portion containing the piezoelectric element or the multilayered piezoelectric element; and an ejection orifice communicating with the liquid chamber.

Figure 3A:
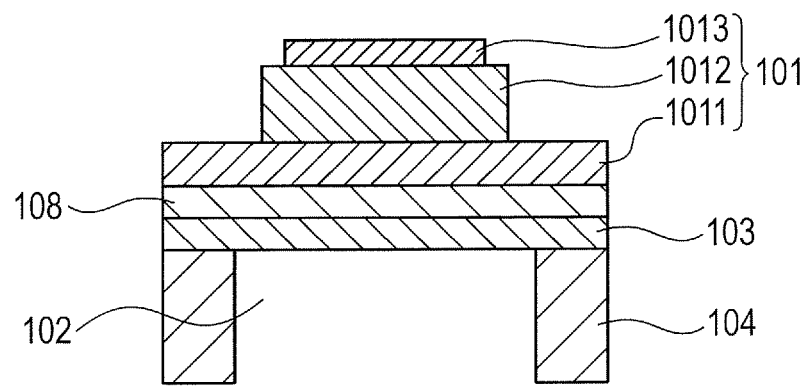
FIGS. 3A and 3B are schematic views each illustrating a configuration of a liquid ejection head according to an embodiment of the present invention.
Figure 3B:
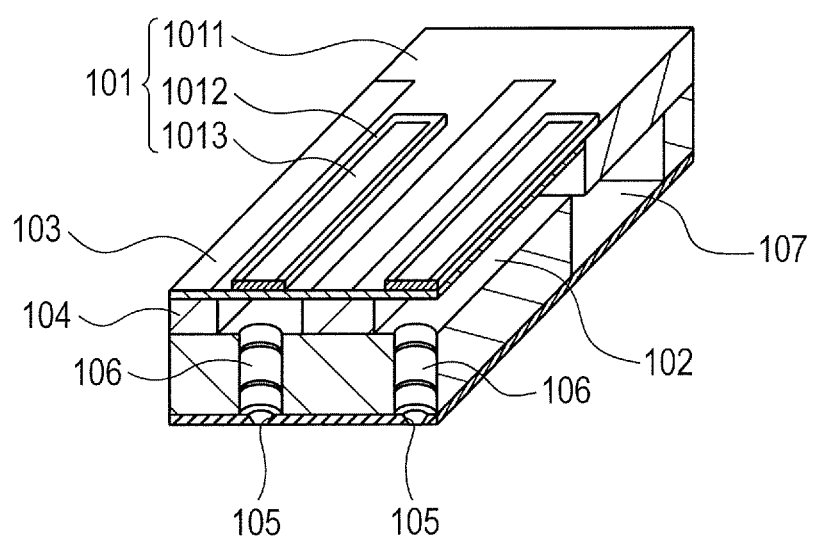

FIGS. 3A and 3B are schematic views each illustrating a configuration of a liquid ejection head according to an embodiment of the present invention. As illustrated in FIGS. 3A and 3B, the liquid ejection head of the present invention is a liquid ejection head including a piezoelectric element 101 of the present invention. The piezoelectric element 101 is a piezoelectric element including at least a first electrode 1011, a piezoelectric material 1012, and a second electrode 1013. The piezoelectric material 1012 is patterned as required as illustrated in FIG. 3B.

FIG. 3B is a schematic view of the liquid ejection head. The liquid ejection head includes ejection orifices 105, individual liquid chambers 102, communicating holes 106 for connecting the individual liquid chambers 102 and the ejection orifices 105, liquid chamber partition walls 104, a common liquid chamber 107, a diaphragm 103, and the piezoelectric elements 101. Each of the piezoelectric elements 101, which is of a rectangular shape in FIG. 3B, may be of a shape besides the rectangular shape such as an elliptical shape, a circular shape, or a parallelogram shape. In general, the piezoelectric materials 1012 are each of a shape in conformity with the shape of the individual liquid chamber 102.

The vicinity of the piezoelectric element 101 included in the liquid ejection head of the present invention is described in detail with reference to FIG. 3A. FIG. 3A is a sectional view of the piezoelectric element in the width direction of the piezoelectric element illustrated in FIG. 3B. The sectional shape of the piezoelectric element 101, which is illustrated in a rectangular shape, may be a trapezoidal shape or a reverse trapezoidal shape.

In FIG. 3A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode. Note that, those differences in name are caused by a production method for the device and an advantageous effect of the present invention can be obtained in any case.

In the liquid ejection head, the diaphragm 103 vertically fluctuates owing to the expansion and contraction of the piezoelectric material 1012 to apply a pressure to liquid in the individual liquid chamber 102. As a result, the liquid is emitted from the ejection orifice 105. The liquid ejection head of the present invention can be used in a printer application or the production of an electronic device.

The diaphragm 103 has a thickness of 1.0 µm or more to 15 µm or less, preferably 1.5 µm or more to 8 µm or less. A material for the diaphragm, which is not limited, is preferably Si. Si for the diaphragm may be doped with B or P. In addition, the buffer layer and the electrode layer on the diaphragm may serve as part of the diaphragm. The buffer layer 108 has a thickness of 5 nm or more to 300 nm or less, preferably 10 nm or more to 200 nm or less. The size of the ejection orifice 105 is 5 µm or more to 40 µm or less in terms of an equivalent circular diameter. The shape of the ejection orifice 105 may be a circular shape, or may be a star shape, a square shape, or a triangular shape.

(Liquid Ejection Apparatus)

Next, a liquid ejection apparatus of the present invention is described. The liquid ejection apparatus of the present invention includes a stage for placing an object and the liquid ejection head.

Figure 4:
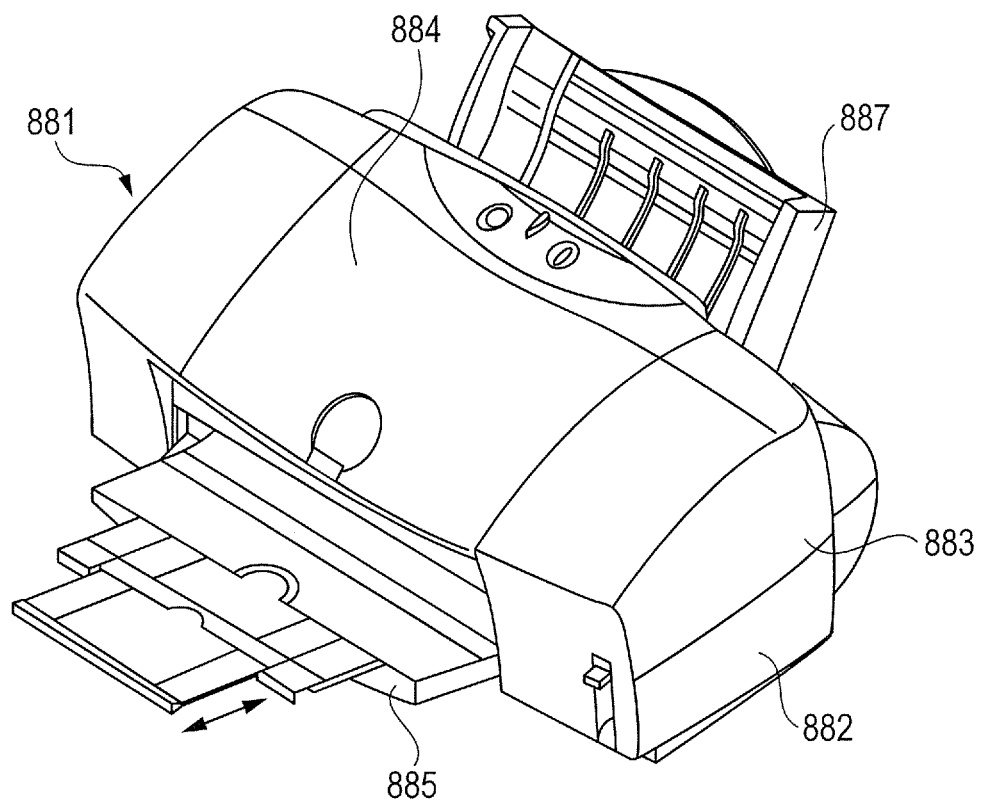
FIG. 4 is a schematic view illustrating a liquid ejection apparatus according to an embodiment of the present invention.
Figure 5:
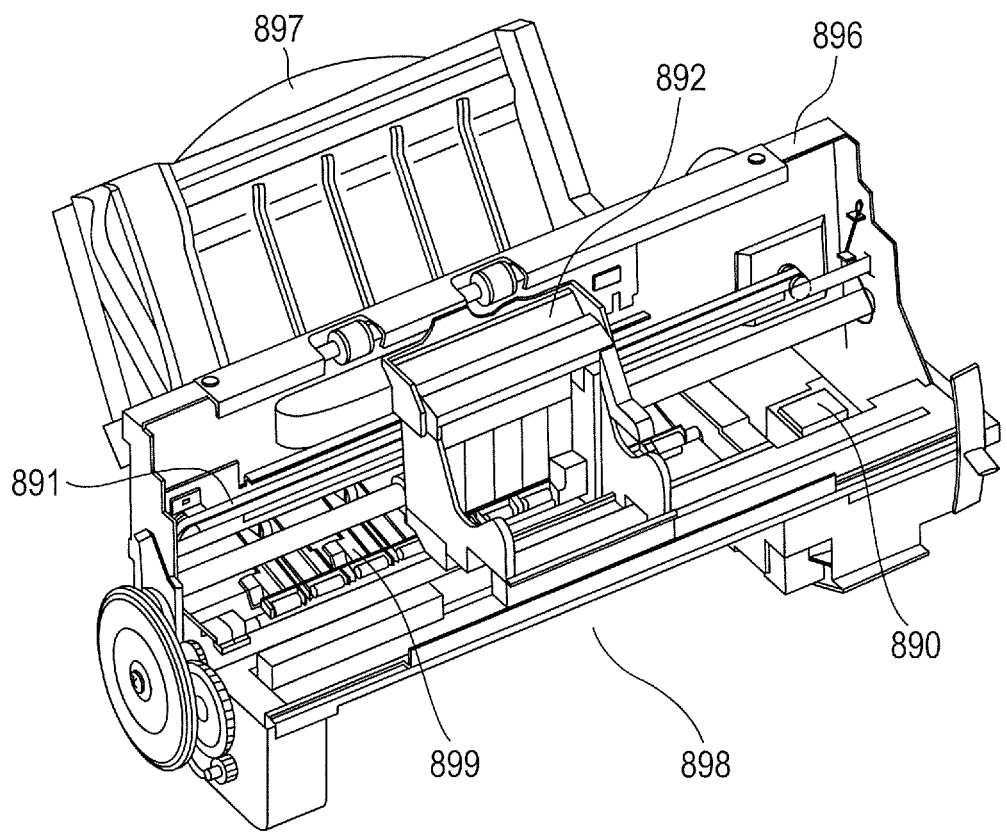
FIG. 5 is a schematic view illustrating the liquid ejection apparatus according to the embodiment of the present invention.

As an example of the liquid ejection apparatus of the present invention, there is an inkjet recording apparatus illustrated in FIGS. 4 and 5. FIG. 5 illustrates a liquid ejection apparatus (inkjet recording apparatus) 881 illustrated in FIG. 4 in a state in which sheathings 882 to 885 and 887 thereof are removed. The inkjet recording apparatus 881 includes an automatic feeding unit 897 for automatically feeding recording sheets as an object into an apparatus main body 896. Further, the inkjet recording apparatus 881 includes a conveying unit 899 as a stage for placing an object for guiding the recording sheet fed from the automatic feeding unit 897 to a predetermined recording position and from the recording position to an ejection port 898, a recording unit 891 for performing recording on the recording sheet conveyed to the recording position, and a recovery unit 890 for performing a recovery process on the recording unit 891. The recording unit 891 includes a carriage 892 which contains the liquid ejection head of the present invention and is reciprocated on a rail.

In this inkjet recording apparatus, the carriage 892 is moved on the rail based on an electric signal sent from a computer, and a drive voltage is applied to electrodes sandwiching a piezoelectric material so that the piezoelectric material is displaced. This displacement of the piezoelectric material pressurizes each individual liquid chamber 102 via the diaphragm 103 illustrated in FIG. 3B, and hence ink is emitted from the ejection orifice 105 so as to perform printing.

The liquid ejection apparatus of the present invention can eject liquid uniformly at high speed, and hence the device can be downsized.

In the example described above, the printer is exemplified. However, the liquid ejection apparatus of the present invention can be used as an inkjet recording apparatus such as a facsimile, a multifunction peripheral, a copying machine, and the like, or as an industrial liquid ejection apparatus. In addition, a user can select a desired object according to an intended use. Incidentally, there may be adopted the constitution in which a liquid ejection head moves relatively to an object placed on a stage as a placing part.

(Ultrasonic Motor)

An ultrasonic motor according to the present invention includes at least: a vibrating body containing the above-mentioned piezoelectric element or the above-mentioned multi-layered piezoelectric element; and a rotor which comes into contact with the vibrating body.

Figure 6A:
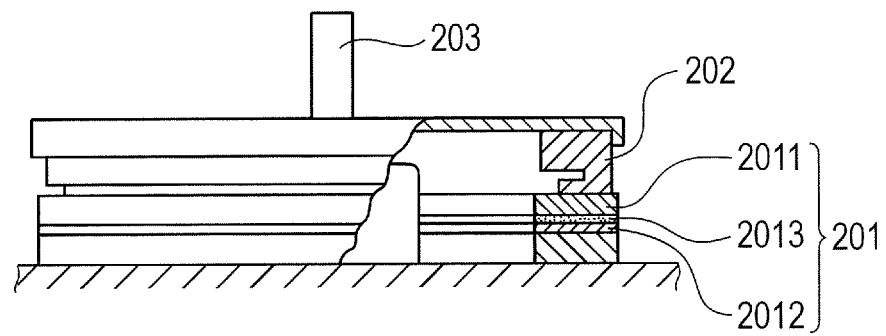
FIGS. 6A and 6B are schematic views each illustrating a configuration of an ultrasonic motor according to an embodiment of the present invention.
Figure 6B:
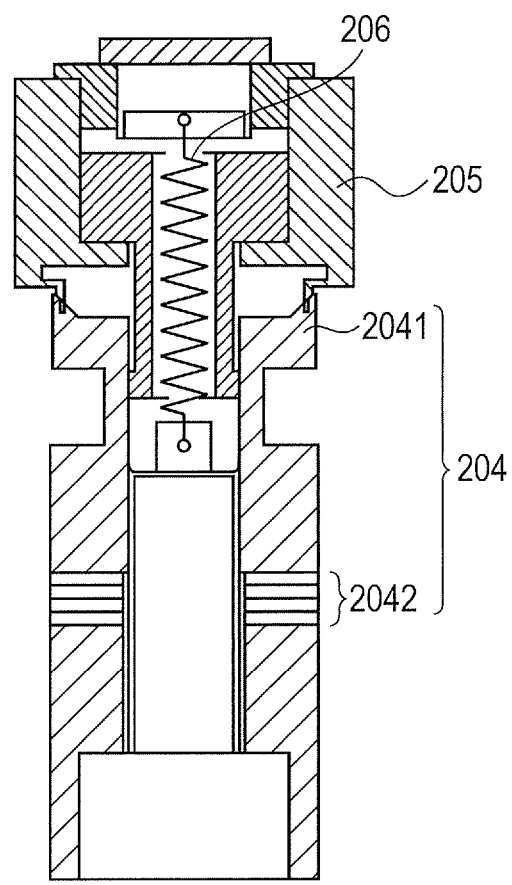

FIGS. 6A and 6B are schematic views each illustrating a configuration of an ultrasonic motor according to an embodiment of the present invention. FIG. 6A illustrates the ultrasonic motor in which the piezoelectric element of the present invention is formed of a single plate. The ultrasonic motor includes an oscillator 201, a rotor 202 which is brought into contact with a sliding surface of the oscillator 201 with a pressure applied from a pressurizing spring (not shown), and an output shaft 203 provided so as to be integral with the rotor 202. The oscillator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric material sandwiched between a first electrode (not shown) and a second electrode (not shown).

The application of two alternating voltages different from each other in phase by an odd multiple of n/2 to the piezoelectric element of the present invention results in the generation of a flexural traveling wave in the oscillator 201, and hence each point on the sliding surface of the oscillator 201 undergoes an elliptical motion. When the rotor 202 is brought into press contact with the sliding surface of the oscillator 201, the rotor 202 receives a frictional force from the oscillator 201 to rotate in the direction opposite to the flexural traveling wave. A body to be driven (not shown) is joined to the output shaft 203, and is driven by the rotary force of the rotor 202.

The application of a voltage to the piezoelectric material results in the expansion and contraction of the piezoelectric material due to a transverse piezoelectric effect. When an elastic body such as a metal is joined to the piezoelectric element, the elastic body is bent by the expansion and contraction of the piezoelectric material. The ultrasonic motor of the kind described here utilizes this principle.

Next, an ultrasonic motor including a piezoelectric element having a multilayered structure is illustrated in FIG. 6B. An oscillator 204 is formed of a multilayered piezoelectric element 2042 sandwiched between tubular metal elastic bodies 2041. The multilayered piezoelectric element 2042 is an element formed of multiple stacked piezoelectric materials (not shown), and includes a first electrode and a second electrode on its outer surfaces of the stack, and internal electrodes on its inner surface of the stack. The metal elastic bodies 2041 are fastened with bolts so that the piezoelectric element 2042 may be sandwiched between and fixed by the metal elastic bodies 2041. Thus, the oscillator 204 is formed.

The application of alternating voltages different from each other in phase to the multilayered piezoelectric element 2042 causes the oscillator 204 to excite two vibrations orthogonal to each other. The two vibrations are combined to form a circular vibration for driving the tip portion of the oscillator 204. Note that, a constricted annular groove is formed in the upper portion of the oscillator 204 to enlarge the displacement of the vibration for driving.

A rotor 205 is brought into contact with the oscillator 204 under a pressure from a spring 206 for pressurization to obtain a frictional force for driving. The rotor 205 is rotatably supported by a bearing.

(Optical Equipment)

Next, an optical equipment of the present invention is described. The optical equipment of the present invention includes a drive unit including the above-mentioned ultrasonic motor.

Figure 7A:
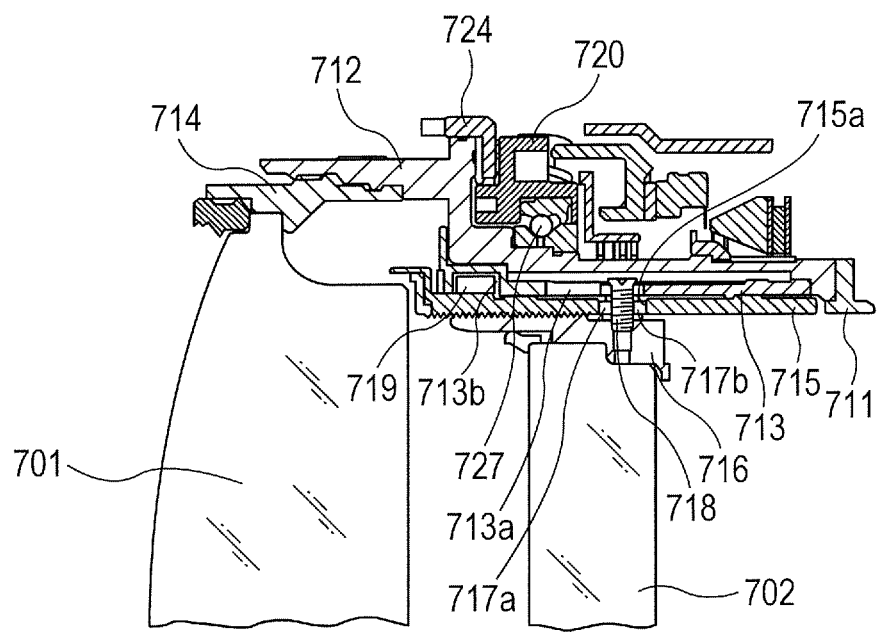
FIGS. 7A and 7B are schematic views each illustrating an optical equipment according to an embodiment of the present invention.
Figure 7B:
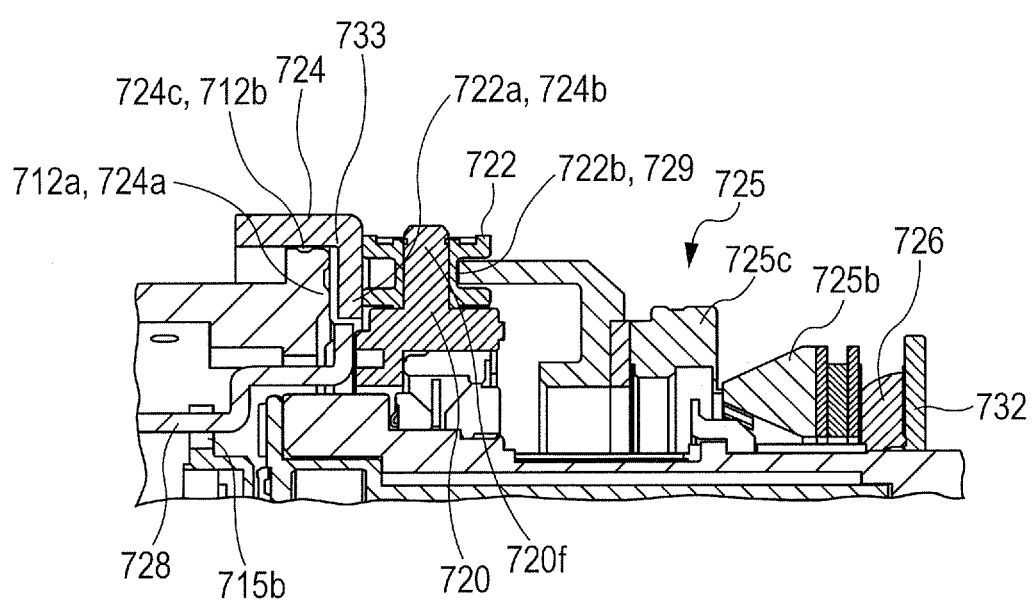
Figure 8:
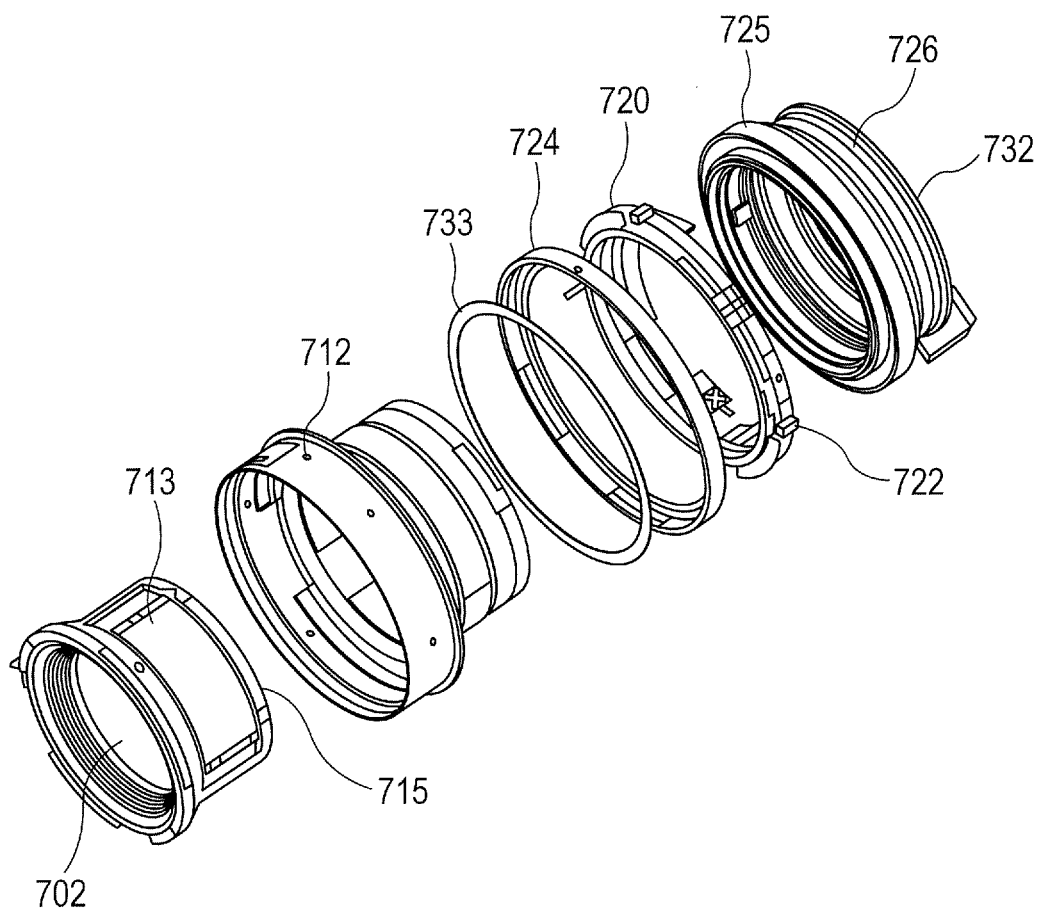
FIG. 8 is a schematic view illustrating the optical equipment according to the embodiment of the present invention.

FIGS. 7A and 7B are sectional views of main parts of an interchangeable lens barrel for a single-lens reflex camera as an example of an optical equipment according to an exemplary embodiment of the present invention. In addition, FIG. 8 is an exploded perspective view of the interchangeable lens barrel for the single-lens reflex camera as the example of the optical equipment according to the exemplary embodiment of the present invention. A fixed barrel 712, a linear guide barrel 713, and a front lens unit barrel 714 are fixed to an attachable/detachable mount 711 for a camera. Those are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear lens unit barrel 716 supporting the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is disposed a rotation transmission ring 720 supported by a ball race 727 in a rotatable manner at a predetermined position with respect to the fixed barrel 712. The rotation transmission ring 720 has shafts 720f extending radially from the rotation transmission ring 720, and rollers 722 are supported by the shafts 720f in a rotatable manner. A large diameter part 722a of the roller 722 contacts with a mount side end surface 724b of a manual focus ring 724. In addition, a small diameter part 722b of the roller 722 contacts with a joining member 729. Six rollers 722 are disposed on the outer periphery of the rotation transmission ring 720 at uniform intervals, and each roller is provided in the relationship as described above.

A low friction sheet (washer member) 733 is disposed on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

Note that, the large diameter part 722a of the roller 722 contacts with the mount side end surface 724a of the manual focus ring in a state in which a pressure is applied by a pressing force of a wave washer 726 pressing an ultrasonic motor 725 to the front of the lens. In addition, similarly, the small diameter part 722b of the roller 722 contacts with the joining member 729 in a state in which an appropriate pressure is applied by a pressing force of the wave washer 726 pressing the ultrasonic motor 725 to the front of the lens.

Movement of the wave washer 726 in the mount direction is restricted by a washer 732 connected to the fixed barrel 712 by bayonet joint. A spring force (biasing force) generated by the wave washer 726 is transmitted to the ultrasonic motor 725, and further to the roller 722, to be a force for the manual focus ring 724 to press the mount side end surface 712a of the fixed barrel 712. In other words, the manual focus ring 724 is integrated in a state in which the manual focus ring 724 is pressed to the mount side end surface 712a of the fixed barrel 712 via the low friction sheet 733.

Therefore, when a control unit (not shown) drives the ultrasonic motor 725 to rotate with respect to the fixed barrel 712, the rollers 722 rotate about the shafts 720f because the joining member 729 is brought into contact by friction to the small diameter parts 722b of the rollers 722. As a result of the rotation of the rollers 722 about the shafts 720f, the rotation transmission ring 720 rotates about the optical axis (automatic focus operation).

In addition, when a manual operation input portion (not shown) gives a rotation force about the optical axis to the manual focus ring 724, the rollers 722 rotate about the shafts 720f by friction force because the mount side end surface 724b of the manual focus ring 724 is brought into contact by pressure to the large diameter parts 722a of the rollers 722. When the large diameter parts 722a of the rollers 722 rotate about the shafts 720f, the rotation transmission ring 720 rotates about the optical axis. In this case, the ultrasonic motor 725 does not rotate because of a friction retaining force between a rotor 725c and a stator 725b (manual focus operation).

Two focus keys 728 are mounted to the rotation transmission ring 720 at opposing positions, and the focus key 728 is fitted to a notch portion 715b disposed on the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear unit barrel 716 whose rotation is restricted by the cam roller 717a and the linear guide groove 713a is moved forward and backward along the cam groove 715a of the cam ring 715 by the cam roller 717b. Thus, the focus lens 702 is driven, and the focus operation is performed.

In this case, the interchangeable lens barrel for the single-lens reflex camera is described above as the optical equipment of the present invention, but the present invention can be applied to any optical equipment including the ultrasonic motor in the drive unit, regardless of a type of the camera, including a compact camera, an electronic still camera, and the like.

(Vibration Apparatus and Dust Removing Apparatus)

A vibration apparatus used for conveying or removing particles, powder, or liquid droplets is used widely for an electronic equipment or the like.

Next, as an example of the vibration apparatus of the present invention including a vibrating body containing a diaphragm and the piezoelectric element or the multilayered piezoelectric element disposed on the diaphragm, a dust removing apparatus is described.

A dust removing apparatus according to the present invention includes at least a vibrating body containing the piezoelectric element or the multilayered piezoelectric element.

Figure 9A:
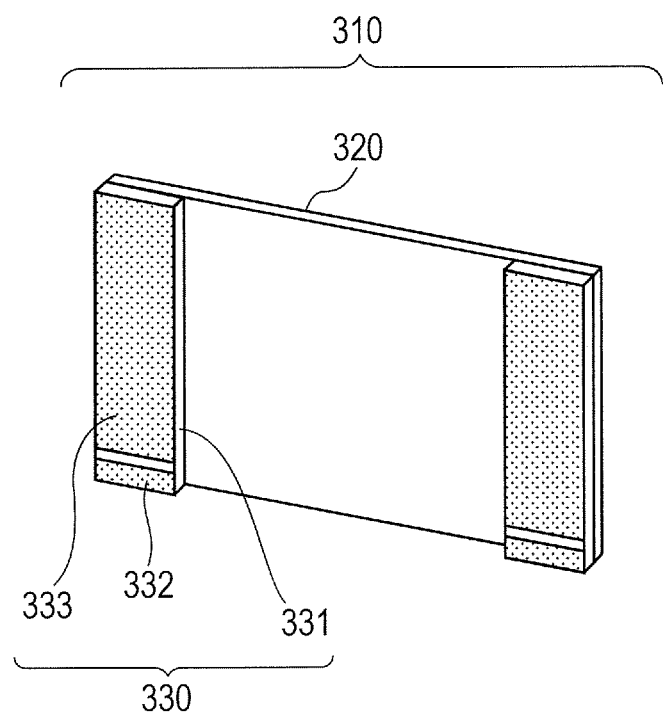
FIGS. 9A and 9B are schematic views each illustrating a vibration apparatus according to an embodiment of the present invention used as a dust removing apparatus.
Figure 9B:
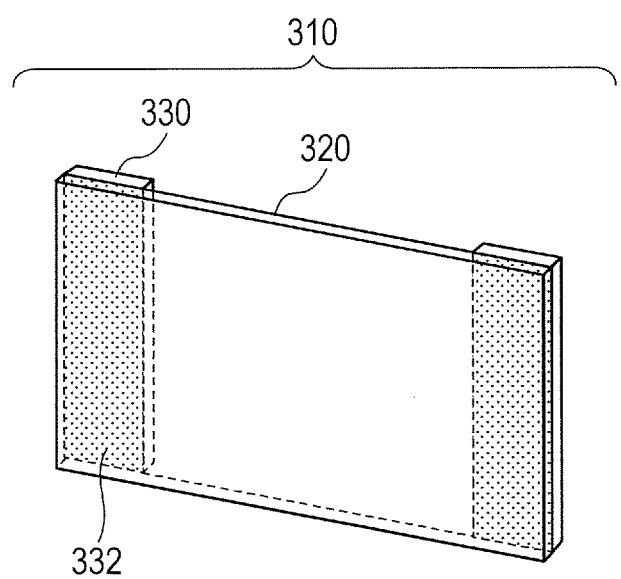

FIGS. 9A and 9B are schematic views each illustrating a dust removing apparatus according to an embodiment of the present invention. A dust removing apparatus 310 includes a plate-like piezoelectric element 330 and a diaphragm 320. The piezoelectric element 330 may also be the multilayered piezoelectric element of the present invention. The material of the diaphragm 320 is not limited. In the case where the dust removing apparatus 310 is used for an optical equipment, a transparent material or a reflective material can be used as the material of the diaphragm 320.

Figures 10A, 10B, 10C:
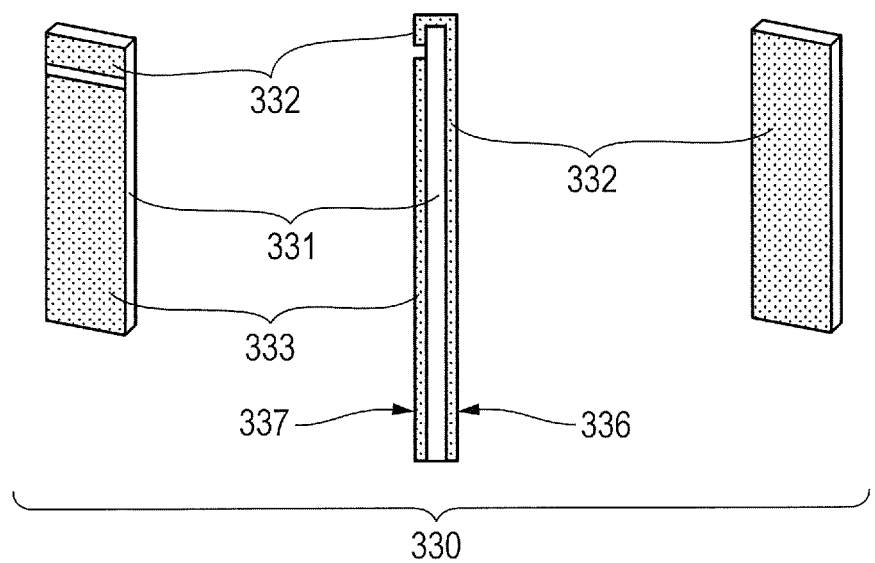
FIGS. 10A, 10B, and 10C are schematic views each illustrating a configuration of a piezoelectric element in the dust removing apparatus of the present invention.

FIGS. 10A to 10C are schematic views each illustrating a configuration of the piezoelectric element 330 illustrated in FIGS. 9A and 9B. FIGS. 10A and 10C illustrate a front surface configuration and a rear surface configuration of the piezoelectric element 330, respectively. FIG. 10B illustrates a side surface configuration thereof. As illustrated in FIGS. 9A and 9B (also in FIGS. 10A and 10B), the piezoelectric element 330 includes a piezoelectric material 331, a first electrode 332, and a second electrode 333. The first electrode 332 and the second electrode 333 are disposed so as to be opposed to each other on the plate planes of the piezoelectric material 331. The piezoelectric element 330 illustrated in FIGS. 9A and 9B may also be the multilayered piezoelectric element of the present invention. In this case, when the piezoelectric material 331 has an alternate structure of piezoelectric materials and internal electrodes, and the internal electrodes are short-circuited to the first electrode 332 or the second electrode 333 alternately, drive waveforms having different phases can be imparted for respective layers of the piezoelectric materials. The front plane of the piezoelectric element 330 illustrated in FIG. 10C, on which the first electrode 332 is disposed, is referred to as a first electrode plane 336. The front plane of the piezoelectric element 330 illustrated in FIG. 10A, on which the second electrode 333 is disposed, is referred to as a second electrode plane 337.

In this case, the electrode plane in the present invention means a plane of the piezoelectric element on which the electrode is disposed. For example, as illustrated in FIGS. 10A to 10C, the first electrode 332 may extend around to the second electrode plane 337.

As illustrated in FIGS. 9A and 9B, as for the piezoelectric element 330 and the diaphragm 320, the plate surface of the diaphragm 320 is fixed to the first electrode plane 336 of the piezoelectric element 330. When the piezoelectric element 330 is driven, a stress is generated between the piezoelectric element 330 and the diaphragm 320 so that out-of-plane oscillation is generated in the diaphragm. The dust removing apparatus 310 of the present invention is a device that removes foreign matters such as dust sticking to the surface of the diaphragm 320 by the out-of-plane oscillation of the diaphragm 320. The out-of-plane oscillation means elastic oscillation in which the diaphragm is displaced in the optical axis direction, namely, in the thickness direction of the diaphragm.

FIGS. 11A and 11B are schematic diagrams each illustrating a vibration principle of the dust removing apparatus 310 of the present invention. The upper figure (FIG. 11A) illustrates a state in which alternating electric voltages having the same phase are applied to a pair of left and right piezoelectric elements 330 so that the out-of-plane oscillation is generated in the diaphragm 320. The polarization direction of the piezoelectric material forming the pair of left and right piezoelectric elements 330 is the same as the thickness direction of the piezoelectric elements 330, and the dust removing apparatus 310 is driven by the seventh oscillation mode. The lower figure (FIG. 11B) illustrates a state in which alternating voltages having reverse phases by 180 degrees are applied to the pair of left and right piezoelectric elements 330 so that the out-of-plane oscillation is generated in the diaphragm 320. The dust removing apparatus 310 is driven by the sixth oscillation mode. The dust removing apparatus 310 of the present invention is a device that can effectively remove dust sticking to the surface of the diaphragm by using at least two oscillation modes selectively.

(Imaging Apparatus)

Figure 12:
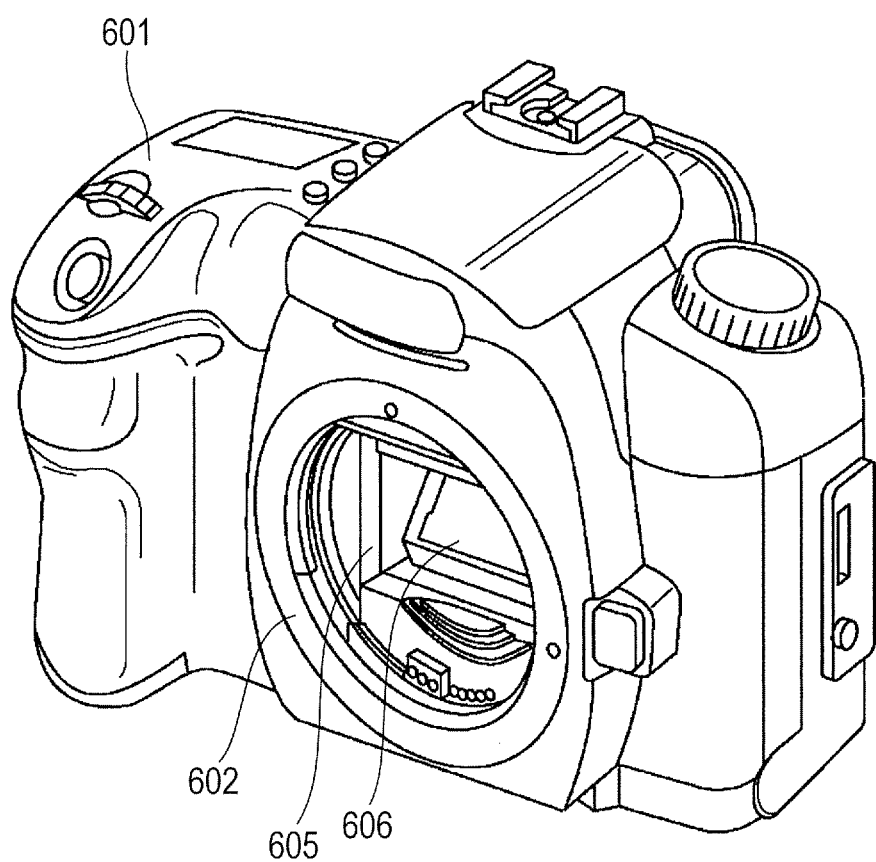
FIG. 12 is a schematic view illustrating an imaging apparatus according to an embodiment of the present invention.
Figure 13:
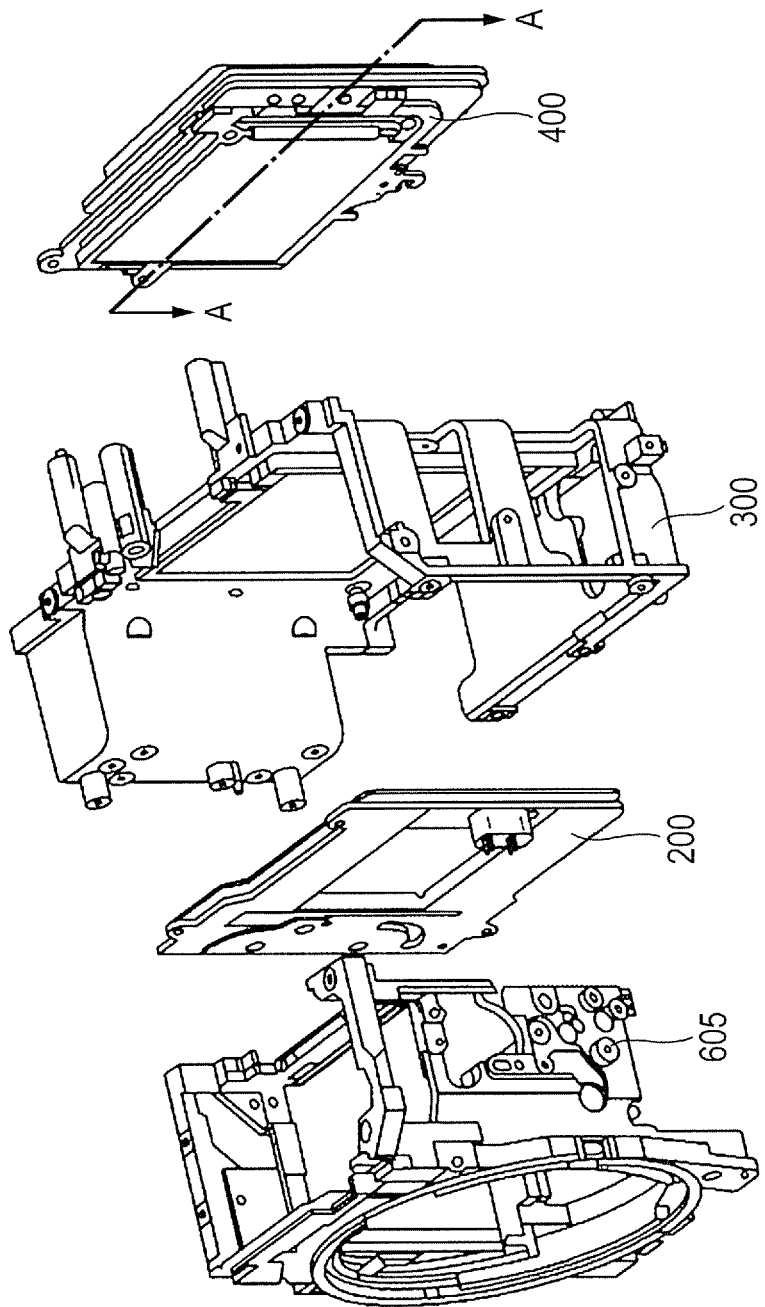
FIG. 13 is a schematic view illustrating the imaging apparatus according to the embodiment of the present invention.

Next, an imaging apparatus of the present invention is described. The imaging apparatus of the present invention is an imaging apparatus including at least the dust removing apparatus and an imaging element unit. The dust removing apparatus includes the diaphragm provided on a light receiving surface of the imaging element unit. FIGS. 12 and 13 are views each illustrating a digital single-lens reflex camera as an example of an imaging apparatus according to an exemplary embodiment of the present invention.

FIG. 12 is a front side perspective view of a camera main body 601 viewed from an object side, in which an imaging lens unit is removed. FIG. 13 is an exploded perspective view illustrating an internal schematic configuration of the camera for describing a peripheral structure of the dust removing apparatus and an imaging unit 400 of the present invention.

A mirror box 605 for guiding an imaging light beam that has passed through the imaging lens is disposed in the camera main body 601, and a main mirror (quick return mirror) 606 is disposed in the mirror box 605. The main mirror 606 can take one of states including a state of being supported at an angle of 45 degrees with respect to an imaging optical axis in order to guide the imaging light beam in the direction to a penta-dach mirror (not shown) and a state of being retreated from the imaging light beam in order to guide the imaging light beam in the direction to an imaging element (not shown).

On the object side of a main body chassis 300 to be a skeleton of the camera main body, the mirror box 605 and a shutter unit 200 are disposed in order from the object side. In addition, on a photographer side of the main body chassis 300, the imaging unit 400 is disposed. The imaging unit 400 is adjusted and disposed so that the imaging surface of the imaging element is parallel to a mounting surface of a mount part 602 to be a reference for mounting the imaging lens unit with a predetermined distance.

In this case, the digital single-lens reflex camera is described above as the imaging apparatus of the present invention, but the imaging apparatus may be a camera with interchangeable imaging lens unit such as a mirrorless digital single-lens camera without the mirror box 605, for example. In addition, the present invention can also be applied to various types of imaging apparatus or electronic and electric devices including the imaging apparatus, such as a video camera with interchangeable imaging lens unit, a copying machine, a facsimile, and a scanner, in particular, a device which is required to remove dust sticking to a surface of an optical component.

(Electronic Equipment)

Next, an electronic equipment of the present invention is described. The electronic equipment of the present invention includes a piezoelectric acoustic component including the piezoelectric element or the multilayered piezoelectric element. As the piezoelectric acoustic component, there are a speaker, a buzzer, a microphone, and a surface acoustic wave (SAW) element.

Figure 14:
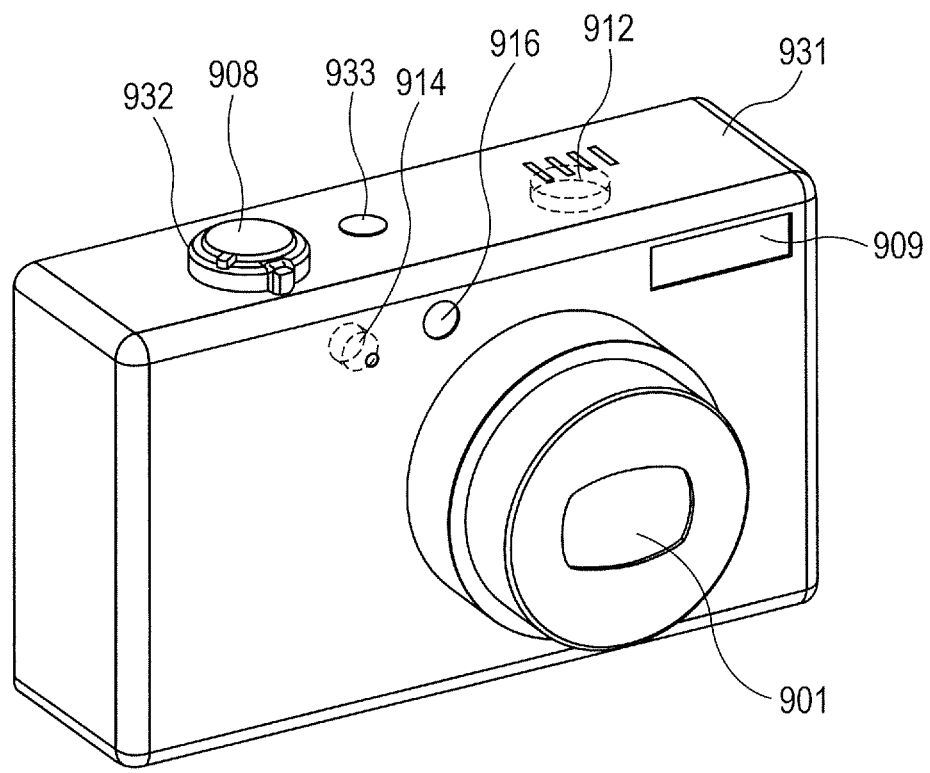
FIG. 14 is a schematic view illustrating an electronic equipment according to an embodiment of the present invention.

FIG. 14 is a general perspective view of a main body 931 of a digital camera as an example of an electronic equipment according to an exemplary embodiment of the present invention, as viewed from the front. On a front surface of the main body 931, there are disposed an optical equipment 901, a microphone 914, a stroboscopic light emission unit 909, and a fill light unit 916. Because the microphone 914 is installed in the main body, the microphone 914 is illustrated by a broken line. In the front of the microphone 914, there is a hole shape provided for collecting external sound.

A power button 933, a speaker 912, a zoom lever 932, and a release button 908 for performing a focus operation are disposed on the top surface of the main body 931. The speaker 912 is installed in the main body 931 and is illustrated by a broken line. In the front of the speaker 912, there is a hole shape provided for transmitting sound to the outside.

The piezoelectric acoustic component of the present invention is used for at least one of the microphone 914, the speaker 912, and the surface acoustic wave element.

In this case, the digital camera is described above as the electronic equipment of the present invention, but the electronic equipment of the present invention includes various types of the electronic equipment including the piezoelectric acoustic component, such as a sound reproduction device, a sound recording device, a mobile phone, or an information terminal.

As described above, the piezoelectric element and the multilayered piezoelectric element of the present invention are each suitably applicable to the liquid ejection head, the liquid ejection apparatus, the ultrasonic motor, the optical equipment, the vibration apparatus, the dust removing apparatus, the imaging apparatus, and the electronic equipment.

Through the use of the lead-free piezoelectric material of the present invention, it is possible to provide the liquid ejection head having the same or higher nozzle density and ejection capacity than the case where the piezoelectric material containing lead is used.

Through the use of the lead-free piezoelectric material of the present invention, it is possible to provide the liquid ejection apparatus having the same or higher ejection speed and ejection accuracy than the case where the piezoelectric material containing lead is used.

Through the use of the lead-free piezoelectric material of the present invention, it is possible to provide the ultrasonic motor having the same or higher driving force and durability than the case where the piezoelectric material containing lead is used.

Through the use of the lead-free piezoelectric material of the present invention, it is possible to provide the optical equipment having the same or higher durability and operation accuracy than the case where the piezoelectric material containing lead is used.

Through the use of the lead-free piezoelectric material of the present invention, it is possible to provide the vibration apparatus having the same or higher vibration performance and durability than the case where the piezoelectric material containing lead is used.

Through the use of the lead-free piezoelectric material of the present invention, it is possible to provide the dust removing apparatus having the same or higher dust removing efficiency than the case where the piezoelectric material containing lead is used.

Through the use of the lead-free piezoelectric material of the present invention, it is possible to provide the imaging apparatus having the same or higher dust removing function than the case where the piezoelectric material containing lead is used.

Through the use of the piezoelectric acoustic component including the lead-free piezoelectric element of the present invention, it is possible to provide the electronic equipment having the same or higher sound producing performance than the case where the piezoelectric material containing lead is used.

The piezoelectric material of the present invention can be used in such a device as an ultrasonic oscillator, a piezoelectric actuator, a piezoelectric sensor, a piezoelectric acoustic equipment, and a ferroelectric memory, as well as the above-mentioned equipment.

Hereinafter, the present invention is described more specifically by way of examples. However, the present invention is not limited by the following examples.

The piezoelectric material of the present invention was produced as follows.

Piezoelectric Material of the Present Invention

Example 1

A metal oxide having the composition $(Li_{0.014}Na_{0.363}K_{0.091}Ba_{0.060}Bi_{0.473})_{0.990}(Ti_{0.995}Fe_{0.005})O_3$, which corresponds to the general formula $(Li_{\alpha x}Na_{\alpha y}K_{\alpha z}Ba_\beta Bi_{0.5\alpha+\gamma})_a(Ti_{\alpha+\beta}Fe_\gamma)O_3$ in the case where $\alpha$ represents 0.935, $\beta$ represents 0.060, $\gamma$ represents 0.005, x represents 0.015, y represents 0.388, z represents 0.097, and a represents 0.990, was weighed as follows. Note that, when 1% deletion of the A-site is omitted, the chemical formula may simply be expressed as 2.8% BLT-72.6% BNT-18.1% BKT-6.0% BTO-0.5% BFO as well.

Lithium carbonate, sodium carbonate, potassium carbonate, barium carbonate, bismuth oxide, titanium oxide (IV), and iron oxide (III) were weighed so as to obtain the ratio of the above-mentioned chemical formula. In a carbonate of an alkali metal, an alkali metal concentration was corrected by weight analysis or atomic absorption analysis using kalibor (sodium tetraphenylborate) in advance. In order to adjust the value of "a", titanium oxide and iron oxide were used.

Manganese dioxide was weighed so that the content of Mn was 0.10 part by weight with respect to 100 parts by weight of the metal oxide having the composition $(Li_{0.014}Na_{0.363}K_{0.091}Ba_{0.060}Bi_{0.473})_{0.990}(Ti_{0.995}Fe_{0.005})O_3$.

Those weighed powders were mixed by dry blending for 24 hours through use of a ball mill. Three parts by weight of a PVA binder with respect to the mixed powder were caused to adhere to the surface of the mixed powder through use of a spray drier.

Next, the granulated powder was supplied to a mold, and a molding pressure of 200 MPa was applied to the granulated powder through use of a press molding machine to produce a disk-shaped compact. The compact exhibited the same results as those obtained by further pressing the compact through use of a cold isostatic pressing machine.

The compact was supplied to an electric furnace and held for 3 hours under the condition that a maximum temperature $T_{max}$ was 1,160° C., and sintered in an atmosphere over 10 hours in total to obtain a ceramics-like piezoelectric material of the present invention.

The average equivalent circle diameter of crystal grains forming the piezoelectric material of the present invention, the number percentage (hereinafter referred to as "$D_{25}$") of crystal grains having an equivalent circle diameter of 25 μm or less, and the relative density were evaluated. As a result, the average equivalent circle diameter was 2.1 μm, $D_{25}$ was 99.6%, and the relative density was 97.0%. Note that, a polarization microscope was mainly used to observe crystal grains. In order to specify a particle diameter of a small crystal grain, a scanning electron microscope (SEM) was used. Photograph images obtained by the polarization microscope and the scanning electron microscope (SEM) were subjected to image processing to calculate an average equivalent circle diameter and $D_{25}$. Further, the relative density was evaluated through use of the Archimedes method.

The ceramics-like piezoelectric material of the present invention was polished so as to have a thickness of 0.5 mm, and the crystal structure thereof was analyzed by X-ray diffraction. As a result, only a peak corresponding to a perovskite structure was observed.

The composition of the piezoelectric material was evaluated by X-ray fluorescence (XRF) analysis, inductively coupled plasma (ICP) emission spectrochemical analysis. As a result, it was found that the piezoelectric material contained 0.10 part by weight of Mn with respect to 100 parts by weight of a metal oxide represented by a chemical formula: $(Li_{0.014}Na_{0.363}K_{0.091}Ba_{0.060}Bi_{0.473})_{0.990}(Ti_{0.996}Fe_{0.005})O_3$. This result means that the weighed composition was matched with the composition after sintering. Further, the contents of elements other than Li, Na, K, Ba, Bi, Ti, Fe, and Mn were equal to or less than a detection limit, i.e., less than 0.0001 part by weight.

Further, the crystal grains were observed again, and it was found that there was no significant difference in average equivalent circle diameter before and after polishing.

Examples 2 to 29

Piezoelectric materials of Examples 2 to 29 were produced in the same process as that of Example 1. Note that, the weighing ratio of each component was set to that shown in Table 1. The average equivalent circle diameter, $D_{25}$, and the relative density were evaluated in the same way as in Example 1. Table 2 shows the results. The composition analysis was performed in the same way as in Example 1, and it was found that, in any sample, the weighed composition shown in Table 1 was matched with the composition after sintering in the stated number of significant figures.

TABLE 1

| | $(Li_{\alpha x}Na_{\alpha y}K_{\alpha z}Ba_\beta Bi_{0.5\alpha+\gamma})_a(Ti_{\alpha+\beta}Fe_\gamma)O_3$ | | | | | | | A/B | Mn Part by weight | BLT $2\alpha x$ | BNT $2\alpha y$ | BKT $2\alpha z$ | BLT-BKT $2\alpha(x+z)$ | BNT-BTO $2\alpha y+\beta$ | $(2\alpha y+\beta)/2\alpha(x+z)$ |
|---|---|---|---|---|---|---|---|---|---|---|---|---|---|---|---|
| | $\alpha$ | $\beta$ | $\gamma$ | x | y | z | a | | | | | | | | |
| Example 1 | 0.935 | 0.060 | 0.005 | 0.015 | 0.388 | 0.097 | 0.990 | 0.990 | 0.10 | 0.028 | 0.726 | 0.181 | 0.209 | 0.786 | 3.8 |
| Example 2 | 0.935 | 0.060 | 0.005 | 0.000 | 0.400 | 0.100 | 0.990 | 0.990 | 0.10 | 0.000 | 0.748 | 0.187 | 0.187 | 0.808 | 4.3 |
| Example 3 | 0.935 | 0.060 | 0.005 | 0.025 | 0.380 | 0.095 | 0.990 | 0.990 | 0.10 | 0.047 | 0.711 | 0.178 | 0.224 | 0.771 | 3.4 |
| Example 4 | 0.935 | 0.060 | 0.005 | 0.035 | 0.372 | 0.093 | 0.990 | 0.990 | 0.10 | 0.065 | 0.696 | 0.174 | 0.239 | 0.756 | 3.2 |
| Example 5 | 0.935 | 0.060 | 0.005 | 0.050 | 0.360 | 0.090 | 0.990 | 0.990 | 0.10 | 0.094 | 0.673 | 0.168 | 0.262 | 0.733 | 2.8 |
| Example 6 | 0.995 | 0.000 | 0.005 | 0.000 | 0.395 | 0.105 | 1.000 | 1.000 | 0.07 | 0.000 | 0.786 | 0.209 | 0.209 | 0.786 | 3.8 |
| Example 7 | 0.965 | 0.030 | 0.005 | 0.000 | 0.392 | 0.108 | 1.000 | 1.000 | 0.07 | 0.000 | 0.757 | 0.208 | 0.208 | 0.787 | 3.8 |
| Example 8 | 0.925 | 0.070 | 0.005 | 0.000 | 0.387 | 0.113 | 1.000 | 1.000 | 0.07 | 0.000 | 0.716 | 0.209 | 0.209 | 0.786 | 3.8 |
| Example 9 | 0.895 | 0.100 | 0.005 | 0.000 | 0.383 | 0.117 | 1.000 | 1.000 | 0.07 | 0.000 | 0.686 | 0.209 | 0.209 | 0.786 | 3.8 |
| Example 10 | 0.845 | 0.150 | 0.005 | 0.000 | 0.376 | 0.124 | 1.000 | 1.000 | 0.07 | 0.000 | 0.635 | 0.210 | 0.210 | 0.785 | 3.7 |
| Example 11 | 0.939 | 0.060 | 0.001 | 0.000 | 0.394 | 0.106 | 1.010 | 1.010 | 0.15 | 0.000 | 0.740 | 0.199 | 0.199 | 0.800 | 4.0 |
| Example 12 | 0.938 | 0.060 | 0.002 | 0.000 | 0.394 | 0.106 | 1.010 | 1.010 | 0.15 | 0.000 | 0.739 | 0.199 | 0.199 | 0.799 | 4.0 |

TABLE 1-continued

| | $(Li_\alpha Na_\alpha K_\alpha Ba_\beta Bi_{0.5\alpha+\gamma})_a(Ti_{\alpha+\beta}Fe_\gamma)O_3$ | | | | | | | Mn Part by weight | BLT 2αx | BNT 2αy | BKT 2αz | BLT-BKT 2α(x+z) | BNT-BTO 2αy+β | (2αy+β)/2α(x+z) |
|---|---|---|---|---|---|---|---|---|---|---|---|---|---|---|
| | α | β | γ | x | y | z | a | | | | | | | |
| Example 13 | 0.935 | 0.060 | 0.005 | 0.000 | 0.394 | 0.106 | 1.010 | 0.15 | 0.000 | 0.737 | 0.198 | 0.198 | 0.797 | 4.0 |
| Example 14 | 0.930 | 0.060 | 0.010 | 0.000 | 0.394 | 0.106 | 1.010 | 0.15 | 0.000 | 0.733 | 0.197 | 0.197 | 0.793 | 4.0 |
| Example 15 | 0.920 | 0.060 | 0.020 | 0.000 | 0.394 | 0.106 | 1.010 | 0.15 | 0.000 | 0.725 | 0.195 | 0.195 | 0.785 | 4.0 |
| Example 16 | 0.890 | 0.060 | 0.050 | 0.000 | 0.394 | 0.106 | 1.010 | 0.15 | 0.000 | 0.701 | 0.189 | 0.189 | 0.761 | 4.0 |
| Example 17 | 0.800 | 0.150 | 0.050 | 0.000 | 0.050 | 0.450 | 1.020 | 0.80 | 0.000 | 0.080 | 0.720 | 0.720 | 0.230 | 0.3 |
| Example 18 | 0.945 | 0.050 | 0.005 | 0.000 | 0.447 | 0.053 | 0.995 | 0.40 | 0.000 | 0.845 | 0.100 | 0.100 | 0.895 | 8.9 |
| Example 19 | 0.930 | 0.050 | 0.020 | 0.000 | 0.447 | 0.053 | 0.995 | 0.40 | 0.000 | 0.831 | 0.099 | 0.099 | 0.881 | 8.9 |
| Example 20 | 0.950 | 0.000 | 0.050 | 0.000 | 0.450 | 0.050 | 0.995 | 0.40 | 0.000 | 0.855 | 0.095 | 0.095 | 0.855 | 9.0 |
| Example 21 | 0.935 | 0.060 | 0.005 | 0.000 | 0.341 | 0.159 | 0.997 | 0.05 | 0.000 | 0.638 | 0.297 | 0.297 | 0.698 | 2.3 |
| Example 22 | 0.920 | 0.060 | 0.020 | 0.000 | 0.340 | 0.160 | 0.997 | 0.05 | 0.000 | 0.626 | 0.294 | 0.294 | 0.686 | 2.3 |
| Example 23 | 0.890 | 0.060 | 0.050 | 0.000 | 0.340 | 0.160 | 0.997 | 0.05 | 0.000 | 0.605 | 0.285 | 0.285 | 0.665 | 2.3 |
| Example 24 | 0.935 | 0.060 | 0.005 | 0.000 | 0.234 | 0.266 | 0.990 | 0.10 | 0.000 | 0.438 | 0.497 | 0.497 | 0.498 | 1.0 |
| Example 25 | 0.920 | 0.060 | 0.020 | 0.000 | 0.234 | 0.266 | 0.990 | 0.10 | 0.000 | 0.431 | 0.489 | 0.489 | 0.491 | 1.0 |
| Example 26 | 0.890 | 0.060 | 0.050 | 0.000 | 0.233 | 0.267 | 0.990 | 0.10 | 0.000 | 0.415 | 0.475 | 0.475 | 0.475 | 1.0 |
| Example 27 | 0.995 | 0.000 | 0.005 | 0.015 | 0.047 | 0.438 | 1.000 | 0.10 | 0.030 | 0.094 | 0.872 | 0.901 | 0.094 | 0.1 |
| Example 28 | 0.980 | 0.000 | 0.020 | 0.000 | 0.050 | 0.450 | 1.000 | 0.10 | 0.000 | 0.098 | 0.882 | 0.882 | 0.098 | 0.1 |
| Example 29 | 0.950 | 0.000 | 0.050 | 0.000 | 0.050 | 0.450 | 1.000 | 0.01 | 0.000 | 0.095 | 0.855 | 0.855 | 0.095 | 0.1 |
| Comparative Example 1 | 0.935 | 0.060 | 0.005 | 0.060 | 0.352 | 0.088 | 0.990 | 0.08 | 0.112 | 0.658 | 0.165 | 0.277 | 0.718 | 2.6 |
| Comparative Example 2 | 0.795 | 0.200 | 0.005 | 0.000 | 0.369 | 0.131 | 1.000 | 0.05 | 0.000 | 0.587 | 0.208 | 0.208 | 0.787 | 3.8 |
| Comparative Example 3 | 0.940 | 0.060 | 0.000 | 0.000 | 0.393 | 0.107 | 1.010 | 0.15 | 0.000 | 0.739 | 0.201 | 0.201 | 0.799 | 4.0 |
| Comparative Example 4 | 0.870 | 0.060 | 0.070 | 0.000 | 0.393 | 0.107 | 1.010 | 0.15 | 0.000 | 0.684 | 0.186 | 0.186 | 0.744 | 4.0 |
| Comparative Example 5 | 0.870 | 0.060 | 0.070 | 0.000 | 0.233 | 0.267 | 0.990 | 0.10 | 0.000 | 0.405 | 0.465 | 0.465 | 0.465 | 1.0 |
| Comparative Example 6 | 0.935 | 0.060 | 0.005 | 0.015 | 0.388 | 0.097 | 0.990 | 0.00 | 0.028 | 0.726 | 0.181 | 0.209 | 0.786 | 3.8 |
| Comparative Example 7 | 0.935 | 0.060 | 0.005 | 0.015 | 0.388 | 0.097 | 0.990 | 0.90 | 0.028 | 0.726 | 0.181 | 0.209 | 0.786 | 3.8 |
| Comparative Example 8 | 0.935 | 0.060 | 0.005 | 0.015 | 0.388 | 0.097 | 0.970 | 0.10 | 0.028 | 0.726 | 0.181 | 0.209 | 0.786 | 3.8 |
| Comparative Example 9 | 0.935 | 0.060 | 0.005 | 0.015 | 0.388 | 0.097 | 1.020 | 0.10 | 0.028 | 0.726 | 0.181 | 0.209 | 0.786 | 3.8 |
| Comparative Example 10 | 0.950 | 0.050 | 0.000 | 0.000 | 0.447 | 0.053 | 0.995 | 0.30 | 0.000 | 0.849 | 0.101 | 0.101 | 0.899 | 8.9 |
| Comparative Example 11 | 0.940 | 0.060 | 0.000 | 0.000 | 0.341 | 0.159 | 0.997 | 0.05 | 0.000 | 0.641 | 0.299 | 0.299 | 0.701 | 2.3 |
| Comparative Example 12 | 0.940 | 0.060 | 0.000 | 0.000 | 0.234 | 0.266 | 0.990 | 0.08 | 0.000 | 0.440 | 0.500 | 0.500 | 0.500 | 1.0 |
| Comparative Example 13 | 1.000 | 0.000 | 0.000 | 0.015 | 0.047 | 0.438 | 1.000 | 0.10 | 0.030 | 0.094 | 0.876 | 0.906 | 0.094 | 0.1 |
| Comparative Example 14 | 0.930 | 0.050 | 0.020 | 0.000 | 0.460 | 0.040 | 0.995 | 0.40 | 0.000 | 0.856 | 0.074 | 0.074 | 0.906 | 12.2 |
| Comparative Example 15 | 0.980 | 0.000 | 0.020 | 0.000 | 0.040 | 0.460 | 1.000 | 0.10 | 0.000 | 0.078 | 0.902 | 0.902 | 0.078 | 0.1 |
| Comparative Example 16 | 0.940 | 0.060 | 0.000 | 0.000 | 0.500 | 0.000 | 0.990 | 0.00 | 0.000 | 0.940 | 0.000 | 0.000 | 1.000 | — |
| Comparative Example 17 | 1.000 | 0.000 | 0.000 | 0.015 | 0.000 | 0.485 | 0.990 | 0.00 | 0.030 | 0.000 | 0.970 | 1.000 | 0.000 | 0.0 |
| Comparative Example 18 | 0.000 | 0.000 | 1.000 | 0.000 | 0.000 | 0.000 | 1.010 | 0.10 | 0.000 | 0.000 | 0.000 | 0.000 | 0.000 | — |
| Comparative Example 19 | 0.470 | 0.030 | 0.500 | 0.000 | 0.500 | 0.000 | 0.995 | 0.00 | 0.000 | 0.470 | 0.000 | 0.000 | 0.500 | — |
| Comparative Example 20 | 0.600 | 0.000 | 0.400 | 0.000 | 0.000 | 0.500 | 0.985 | 0.00 | 0.000 | 0.000 | 0.000 | 0.600 | 0.000 | 0.0 |

TABLE 2

| | Average equivalent circle diameter [μm] | $D_{25}$ [%] | Relative density [%] |
|---|---|---|---|
| Example 1 | 2.1 | 99.6 | 97.0 |
| Example 2 | 2.3 | 99.8 | 97.3 |
| Example 3 | 1.9 | 100.0 | 96.6 |
| Example 4 | 1.0 | 100.0 | 94.2 |
| Example 5 | 0.3 | 100.0 | 93.9 |
| Example 6 | 0.9 | 100.0 | 98.5 |
| Example 7 | 1.2 | 100.0 | 98.4 |
| Example 8 | 2.3 | 99.8 | 96.8 |
| Example 9 | 5.0 | 99.2 | 94.4 |
| Example 10 | 8.9 | 99.0 | 93.2 |
| Example 11 | 2.2 | 99.4 | 96.8 |
| Example 12 | 2.3 | 99.8 | 97.5 |
| Example 13 | 2.3 | 99.7 | 97.4 |
| Example 14 | 2.9 | 99.5 | 97.0 |
| Example 15 | 3.4 | 99.5 | 95.5 |
| Example 16 | 3.9 | 99.4 | 93.5 |

TABLE 2-continued

| | Average equivalent circle diameter [μm] | $D_{25}$ [%] | Relative density [%] |
|---|---|---|---|
| Example 17 | 9.9 | 99.0 | 93.0 |
| Example 18 | 2.2 | 99.9 | 97.6 |
| Example 19 | 3.1 | 99.6 | 95.8 |
| Example 20 | 3.3 | 99.4 | 93.7 |
| Example 21 | 2.5 | 100.0 | 98.0 |
| Example 22 | 3.6 | 100.0 | 97.4 |
| Example 23 | 3.7 | 99.8 | 96.1 |
| Example 24 | 2.8 | 99.5 | 96.6 |
| Example 25 | 3.9 | 99.4 | 95.1 |
| Example 26 | 4.1 | 99.2 | 93.8 |
| Example 27 | 3.0 | 99.4 | 96.5 |
| Example 28 | 4.6 | 99.2 | 94.4 |
| Example 29 | 7.7 | 99.0 | 93.7 |
| Comparative Example 1 | 0.2 | 100.0 | 92.2 |
| Comparative Example 2 | 10.2 | 90.2 | 93.5 |
| Comparative Example 3 | 1.8 | 99.7 | 94.6 |
| Comparative Example 4 | — | — | 99.4 |
| Comparative Example 5 | — | — | 99.5 |
| Comparative Example 6 | 0.9 | 100.0 | 98.0 |
| Comparative Example 7 | 11.2 | 84.2 | 92.5 |
| Comparative Example 8 | 16.8 | 60.2 | 91.2 |
| Comparative Example 9 | 0.1 | 100.0 | 95.9 |
| Comparative Example 10 | 2.1 | 99.9 | 97.5 |
| Comparative Example 11 | 2.3 | 99.8 | 97.6 |
| Comparative Example 12 | 2.5 | 99.7 | 96.4 |
| Comparative Example 13 | 2.8 | 99.6 | 96.1 |
| Comparative Example 14 | 3.0 | 99.7 | 95.0 |
| Comparative Example 15 | 4.2 | 98.9 | 92.8 |
| Comparative Example 16 | 1.8 | 100.0 | 98.1 |
| Comparative Example 17 | 7.5 | 98.9 | 93.5 |
| Comparative Example 18 | 1.6 | 100.0 | 98.5 |
| Comparative Example 19 | 2.5 | 99.7 | 92.6 |
| Comparative Example 20 | 4.4 | 99.0 | 92.2 |

(Influence of Sintering Temperature)

The piezoelectric material of the present invention was produced in the same process as that of Examples 1 to 29 except for setting $T_{max}$ to 1,100° C. or 1,200° C. As a result, the weighed composition was matched with the composition after sintering, the average equivalent circle diameter was in a range of 0.3 μm to 10 μm, $D_{25}$ was 99.0% or more, and the relative density was 93.0% or more.

(Influence of Raw Materials to be Used)

A perovskite-type intermediate compound in a stochiometric ratio was synthesized from the same raw materials as those of Example 1 in advance. Specifically, powder of bismuth lithium titanate, bismuth sodium titanate, bismuth potassium titanate, and barium titanate was synthesized by calcination at a maximum temperature of 1,000° C. Bismuth ferrite was synthesized by calcination at 550° C. The average particle diameter of those powders was in a range of 100 nm to 300 nm.

The piezoelectric material of the present invention was produced in the same process as that of Examples 1 to 29 except for using those perovskite-type intermediate compounds. The weighed composition was matched with the composition after sintering, the average equivalent circle diameter was in a range of 0.3 μm to 10 μm, $D_{25}$ was 99.0% or more, and the relative density was 93.0% or more.

Comparative Examples 1 to 20

Ceramics for comparison was produced in the same process as that of Example 1. Note that, the weighed ratio of each component was set to that shown in Table 1. In Comparative Examples 17 and 20, $T_{max}$ was set to 1,000° C., and in Comparative Example 18, $T_{max}$ was set to 800° C. Each ceramics for comparison was evaluated for the average equivalent circle diameter and the relative density in the same way as in Example 1. Table 2 shows the results. Incidentally, the symbol "-" in the table means that a boundary between crystal grains could not be identified in a micrograph and the average equivalent circle diameter and $D_{25}$ could not therefore be calculated. It is considered that since the ceramics of Comparative Examples 4 and 5 have large γ values, the crystallization temperature and the melting temperature became close to each other, whereby conversion to liquid phase of crystal grains was caused during sintering. Next, the composition analysis was performed in the same way as in Example 1. As a result, it was found that, in any sample, the weighed composition shown in Table 1 was matched with the composition after sintering in the stated number of significant figures.

Figure 15:
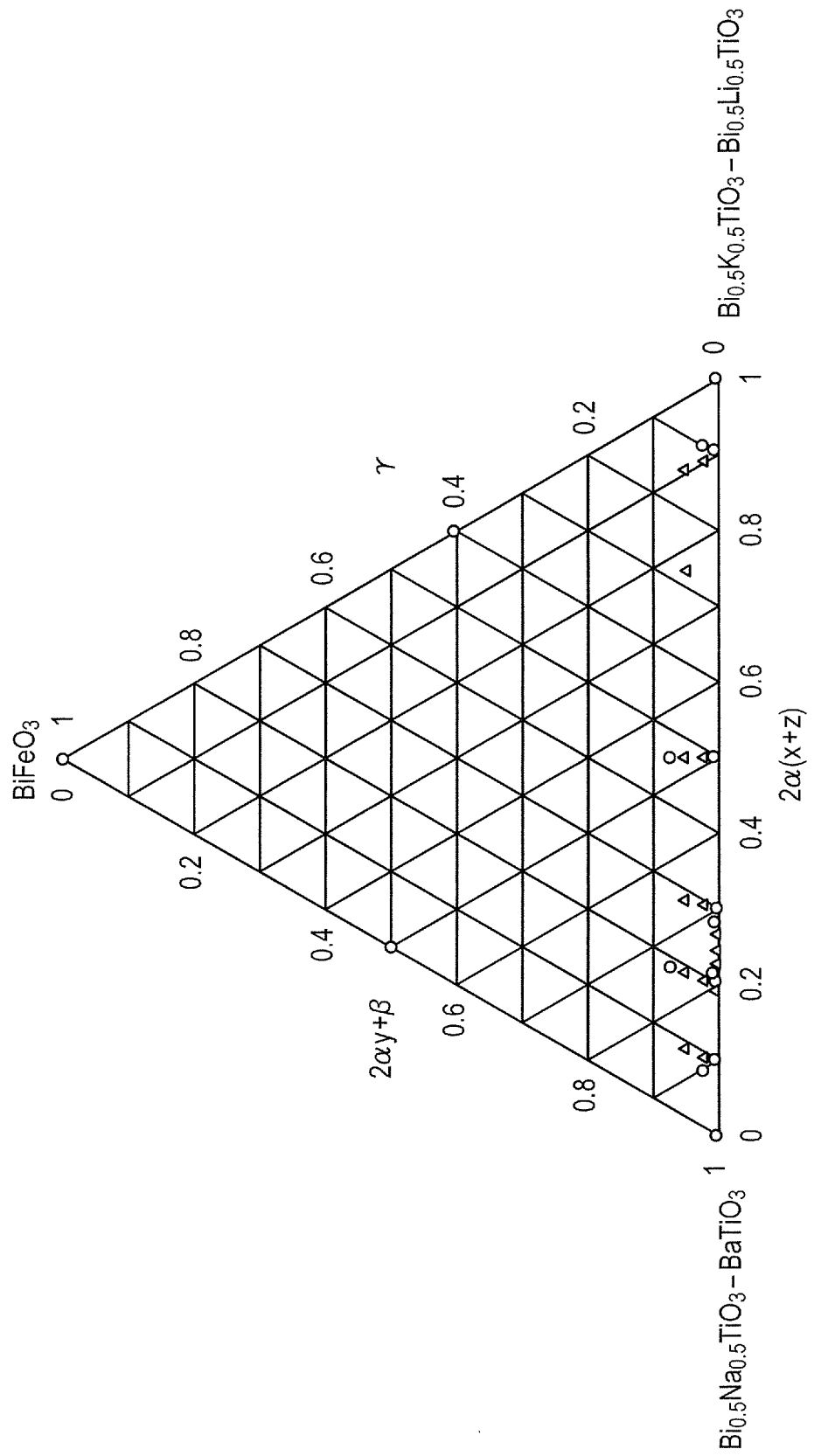
FIG. 15 is a phase diagram showing a relationship among a $2\alpha y+\beta$ value, a $2\alpha(x+z)$ value, and a $\gamma$ value in compositions of piezoelectric materials of Examples 1 to 29 according to the present invention and ceramics of Comparative Examples 1 to 20.

FIG. 15 is a phase diagram showing a relationship among a 2αy+β value, a 2α(x+z) value, and a γ value in compositions of piezoelectric materials of Examples 1 to 29 according to the present invention and ceramics of Comparative Examples 1 to 20. In the phase diagram, a triangular symbol represents a composition of each example, and a circular symbol represents a composition of each comparative example.

Next, the piezoelectric element of the present invention was produced.

Production of Piezoelectric Element and Evaluation of Characteristics

Examples 1 to 29

Subsequently, piezoelectric elements were produced through use of the piezoelectric materials of Examples 1 to 29.

A gold electrode having a thickness of 400 nm was formed on both front and back surfaces of the disk-shaped ceramics serving as a piezoelectric material portion by a DC sputtering method. Note that, titanium was formed as an adhesion layer of 30 nm between the electrode and the ceramics. The ceramics with electrodes was cut to produce a strip-shaped piezoelectric element of 10 mm×2.5 mm×0.5 mm.

The piezoelectric element thus obtained was set in silicone oil at room temperature and subjected to polarization treatment by applying an electric field of 5.4 kV/mm between the electrodes on the front and back surfaces for 30 minutes.

The piezoelectric element of the present invention in which polarization axes were aligned in a given direction was evaluated for depolarization temperature, a piezoelectric constant $d_{33}$, and resistivity R. Table 3 shows the results.

For measuring the piezoelectric constant $d_{33}$, a polarized piezoelectric element and a piezoelectric constant measurement device $d_{33}$ meter based on the Berlincourt method (manufactured by Alpha Corporation) were used. This evaluation was repeated while raising the heating and retention temperature from 25° C. to 360° C. with 5° C. increments, and the depolarization temperature $T_d$ at which the piezoelectric constant became the original value of less than 70% was evaluated. Each heating and retention temperature was kept for 10 minutes.

As evaluation of an insulation property, the resistivity was measured. A DC bias of 10 V was applied between two electrodes of a polarized piezoelectric element, and the resistivity was determined from a leak current value of 20 seconds later. If this resistivity is $1.0101° \Omega\cdot cm$ or more, more preferably $1.0\times10^{11}$ $\Omega\cdot cm$ or more, it can be said that the piezoelectric element has a sufficient insulation property for practical use.

TABLE 3

|  | $T_a$ [° C.] | $d_{33}$ [pC/N] | R [$10^9$ Ωcm] |
|---|---|---|---|
| Example 1 | 195 | 153 | 300 |
| Example 2 | 180 | 154 | 310 |
| Example 3 | 190 | 151 | 290 |
| Example 4 | 195 | 150 | 300 |
| Example 5 | 195 | 148 | 300 |
| Example 6 | 180 | 148 | 280 |
| Example 7 | 180 | 151 | 280 |
| Example 8 | 165 | 153 | 290 |
| Example 9 | 195 | 142 | 270 |
| Example 10 | 220 | 141 | 220 |
| Example 11 | 170 | 148 | 270 |
| Example 12 | 175 | 152 | 230 |
| Example 13 | 180 | 155 | 220 |
| Example 14 | 190 | 154 | 190 |
| Example 15 | 190 | 154 | 98 |
| Example 16 | 150 | 147 | 28 |
| Example 17 | 225 | 140 | 14 |
| Example 18 | 145 | 141 | 720 |
| Example 19 | 150 | 148 | 660 |
| Example 20 | 140 | 145 | 510 |
| Example 21 | 195 | 140 | 220 |
| Example 22 | 200 | 146 | 200 |
| Example 23 | 195 | 142 | 180 |
| Example 24 | 200 | 138 | 300 |
| Example 25 | 210 | 144 | 280 |
| Example 26 | 190 | 140 | 240 |
| Example 27 | 205 | 131 | 43 |
| Example 28 | 210 | 139 | 190 |
| Example 29 | 200 | 142 | 140 |
| Comparative Example 1 | 80 | 14 | 0.81 |
| Comparative Example 2 | 120 | 125 | 190 |
| Comparative Example 3 | 160 | 128 | 280 |
| Comparative Example 4 | 60 | 62 | 0.55 |
| Comparative Example 5 | 85 | 58 | 0.97 |
| Comparative Example 6 | 180 | 44 | 0.75 |
| Comparative Example 7 | — | — | 14 |
| Comparative Example 8 | 180 | 28 | 22 |
| Comparative Example 9 | — | 4 | 620 |
| Comparative Example 10 | 135 | 125 | 550 |
| Comparative Example 11 | 190 | 123 | 220 |
| Comparative Example 12 | 195 | 122 | 270 |
| Comparative Example 13 | 200 | 114 | 38 |
| Comparative Example 14 | 100 | 140 | 440 |
| Comparative Example 15 | 180 | 105 | 170 |
| Comparative Example 16 | 110 | 125 | 370 |
| Comparative Example 17 | 200 | 81 | 12 |
| Comparative Example 18 | >360 | 19 | 0.44 |
| Comparative Example 19 | 80 | 140 | 1.5 |
| Comparative Example 20 | 360 | 95 | 7.4 |

(Influence of Electrode Material)

The piezoelectric element of the present invention was produced in the same process as that of Examples 1 to 29 except for changing electrodes to baking of a silver paste. As a result, the piezoelectric element thus produced exhibited the characteristics equivalent to those of the piezoelectric element of the present invention having gold electrodes.

(Influence of Sintering Temperature)

The piezoelectric element of the present invention was produced in the same process as that of Examples 1 to 29 except for setting $T_{max}$ to 1,100° C. or 1,200° C. As a result, the piezoelectric element thus produced exhibited the characteristics equivalent to those of the piezoelectric element of the present invention sintered at 1,160° C.

(Influence of Raw Materials to be Used)

The piezoelectric element of the present invention was produced in the same process as that of Examples 1 to 29 except for using the above-mentioned perovskite-type intermediate compound. As a result, the piezoelectric element thus produced exhibited the characteristics equivalent to those of the piezoelectric element of the present invention produced by mixing compounds of respective metals.

Comparative Examples 1 to 20

Piezoelectric elements were produced by the same method as that of Examples 1 to 29 through use of ceramics for comparison of Comparative Examples 1 to 20. The piezoelectric elements were evaluated by the same method as that of Examples 1 to 29. Table 3 shows the results. Note that, a symbol "-" indicates that a piezoelectric constant is too small to be quantified. Further, the description ">360" indicates that depolarization temperature is too high to be specified by the method.

It is understood from the comparison between Comparative Example 1 and Examples 1 to 5 that, when "x" is more than 0.050, the insulation property is degraded, which makes it difficult to perform polarization treatment and also degrades piezoelectric performance.

It is understood from the comparison between Comparative Example 2 and Examples 6 to 10 that, when "β" is more than 0.150, the piezoelectric performance is degraded.

It is understood from the comparison between Comparative Examples 3, 4, 5, and 10 to 13 and Examples 11 to 16 and 21 to 29 that, when "γ" is less than 0.010, the piezoelectric performance is degraded, and when "γ" is more than 0.050, the insulation property is degraded, which makes it difficult to perform the polarization treatment and also degrades the piezoelectric performance.

It is understood from the comparison between Comparative Examples 6 and 7 and Example 1 that, when the content of Mn is less than 0.01 part by weight, the insulation property is remarkably degraded, and when the content of Mn is more than 0.80 part by weight, the piezoelectric performance disappears.

It is understood from the comparison between Comparative Examples 8 and 9 and Example 1 that, when "a" is less than 0.980, the insulation property and piezoelectric performance are degraded, and when "a" is more than 1.020, the piezoelectric performance is remarkably degraded. Note that, the ceramics of Comparative Example 8 is brittle due to the abnormal grain growth, and the ceramics of Comparative Example 9 was in an insufficiently sintered state in which the shrinkage of the ceramics by sintering hardly proceeded.

It is understood from the comparison between Comparative Example 14 and Example 19 and the comparison between Comparative Example 15 and Example 28 that, when "y" is less than 0.045 or "z" is more than 0.450, the piezoelectric performance is degraded, and when "y" is more than 0.450 or "z" is less than 0.045, the depolarization temperature is decreased.

Referring to Comparative Examples 2 and 18 to 20, it is understood that, when "α" is less than 0.800, the piezoelectric performance or insulation property becomes insufficient. Referring to Comparative Example 17, it is understood that, when "α" is more than 0.999, the insulation property is degraded.

It is understood from Table 3 that the piezoelectric element satisfying $2\alpha y+\beta \geq 2\alpha(x+z)$ is particularly excellent in insulation property and piezoelectric performance. The piezoelectric element which satisfies $2\alpha y+\beta \geq 4.6\alpha(x+z)$, that is, which has large $(2\alpha y+\beta)/2\alpha(x+y)$ including 2.3 is further excellent in piezoelectric performance.

Next, a multilayered piezoelectric element of the present invention was produced.

Multilayered Piezoelectric Element

Example 30

A metal oxide having the composition $(Li_{0.014}Na_{0.363}K_{0.091}Ba_{0.060}Bi_{0.473})_{0.990}(Ti_{0.995}Fe_{0.005})O_3$ similar to Example 1, which corresponds to the general formula $(Li_{\alpha x}Na_{\alpha y}K_{\alpha z}Ba_{\beta}Bi_{0.5\alpha+\gamma})_a(Ti_{\alpha+\beta}Fe_{\gamma})O_3$ in the case where α represents 0.935, β represents 0.060, γ represents 0.005, x represents 0.015, y represents 0.388, z represents 0.097, and a represents 0.990, was weighed with the same raw materials and method as in Example 1.

Lithium carbonate, sodium carbonate, potassium carbonate, barium carbonate, bismuth oxide, titanium oxide (IV), and iron oxide (III) were weighed so as to obtain the ratio of the above-mentioned chemical formula. In a carbonate of an alkali metal, an alkali metal concentration was corrected by weight analysis or atomic absorption analysis using kalibor (sodium tetraphenylborate) in advance. In order to adjust the value of "a", titanium oxide and iron oxide were used.

Manganese dioxide was weighed so that the content of Mn was 0.10 part by weight with respect to 100 parts by weight of the metal oxide having the above-mentioned composition $(Li_{0.014}Na_{0.363}K_{0.091}Ba_{0.060}Bi_{0.473})0.990(Ti_{0.995}Fe_{0.005})O_3$. Silicon dioxide was weighed so that the content of Si serving as an accessory component was 0.0140 part by weight in terms of a metal with respect to 100 parts by weight of the metal oxide having the above-mentioned composition $(Li_{0.014}Na_{0363}K_{0.091}Ba_{0.060}Bi_{0.473})_{0.990}(Ti_{0.995}Fe_{0.005})O_3$.

Polyvinyl butyral (PVB) was added to the weighed powder and mixed. After that, the mixture was formed into a sheet by a doctor blade method to obtain a green sheet having a thickness of 50 μm. A conductive paste for internal electrodes was printed onto the green sheet. As the conductive paste, a paste made of an alloy containing 70% Ag and 30% Pd (Ag/Pd=2.33) was used. Nine green sheets coated with the conductive paste were laminated, and the laminate was calcined at 1,100° C. for 5 hours to obtain a sintered body. The sintered body thus obtained was cut to a size of 10 mm×2.5 mm, and a side surface thereof was polished. Then, a pair of external electrodes (first electrode and second electrode) for short-circuiting the internal electrodes alternately were formed by sputtering Au to produce a multilayered piezoelectric element having a structure illustrated in FIG. 2B.

The internal electrode of the multilayered piezoelectric element thus obtained was observed to find that Ag—Pd serving as an electrode material was formed alternately with the piezoelectric material.

Prior to the evaluation of piezoelectric properties, a sample was polarized. Specifically, the sample was heated to 80° C. on a hot plate, and a voltage of 4.0 kV/mm was applied between the first electrode and the second electrode for 30 minutes. Then, the sample was cooled to room temperature while the voltage was being applied thereto.

The piezoelectric properties of the multilayered piezoelectric element thus obtained were evaluated, and as a result, it was found that the multilayered piezoelectric element had a sufficient insulation property and satisfactory piezoelectric characteristics equivalent to those of the piezoelectric material of Example 1.

Example 31

A conductive paste for internal electrodes was printed onto a green sheet produced in the same way as in Example 30. As the conductive paste, a Ni paste was used. Nine green sheets coated with the conductive paste were laminated, and the laminate was subjected to thermal compression bonding.

The laminate subjected to thermal compression bonding was calcined in a tubular furnace. The calcination was performed in the atmosphere up to 300° C. to conduct debinding. After that, the atmosphere was switched to a reducing atmosphere ($H_2:N_2$=2:98, oxygen concentration: $2\times10^{-6}$ Pa) and held at 1,100° C. for 5 hours. In the temperature fall process, the oxygen concentration was changed to 30 Pa from 900° C. or less, and the temperature was lowered to room temperature.

The sintered body thus obtained was cut to a size of 10 mm×2.5 mm, and a side surface thereof was polished. Then, a pair of external electrodes (first electrode and second electrode) for short-circuiting the internal electrodes alternately were formed by sputtering Au to produce a multilayered piezoelectric element having a structure illustrated in FIG. 2B.

The internal electrode of the multilayered piezoelectric element thus obtained was observed to find that Ni serving as an electrode material (electrode layer) was formed alternately with the piezoelectric material layer. The obtained multilayered piezoelectric element was heated on a hot plate to 80° C., and a voltage of 4.0 kV/mm was applied between the first electrode and the second electrode for 30 minutes. Then, the multilayered piezoelectric element was cooled to room temperature while the voltage was being applied thereto.

The piezoelectric properties of the multilayered piezoelectric element thus obtained were evaluated, and as a result, it was found that the multilayered piezoelectric element had a sufficient insulation property and satisfactory piezoelectric characteristics equivalent to those of the piezoelectric material of Example 1.

Comparative Example 21

A multilayered piezoelectric element was produced in the same process as that of Example 30. Note that, the calcination temperature was 1,200° C., and the internal electrode was made of an alloy containing 95% Ag and 5% Pd (Ag/Pd=19).

The internal electrode was observed with a scanning electron microscope. As a result, it was found that the internal electrode was dissolved and dotted in an island shape. Thus, the multilayered piezoelectric element was not polarized because the internal electrode was not brought into conduction. Therefore, a piezoelectric constant was not able to be measured.

Comparative Example 22

A multilayered piezoelectric element was produced in the same process as that of Comparative Example 21. Note that, the internal electrode was made of an alloy containing 5% Ag and 95% Pd (Ag/Pd=0.05).

The internal electrode was observed with a scanning electron microscope. It was found that Ag—Pd serving as an electrode material was sintered insufficiently. Thus, the multilayered piezoelectric element was not polarized because the internal electrode was not brought into conduction. Therefore, a piezoelectric constant was not able to be measured.

Example 32

Through the use of the piezoelectric element of Example 1, the liquid ejection head having the structure illustrated in FIG. 3B was produced. It was confirmed that ink was ejected in accordance with an input electric signal.

Example 33

Through the use of the liquid ejection head of Example 32, the liquid ejection apparatus having the structure illustrated in FIG. 4 was produced. It was confirmed that ink was ejected on a recording medium in accordance with an input electric signal.

Example 34

Through the use of the piezoelectric element of Example 1, the ultrasonic motor having the structure illustrated in FIG. 6A was produced. It was confirmed that the motor rotated in accordance with an applied alternating voltage.

Example 35

Through the use of the ultrasonic motor of Example 34, the optical equipment having the structure illustrated in FIGS. 7A and 7B was produced. It was confirmed that the automatic focus operation was performed in accordance with an applied alternating voltage.

Example 36

Through the use of the piezoelectric element of Example 1, the dust removing apparatus having the structure illustrated in FIGS. 9A and 9B was produced. Plastic beads were scattered, and an alternating voltage was applied. Then, satisfactory dust removing efficiency was confirmed.

Example 37

Through the use of the dust removing apparatus of Example 36, the imaging apparatus having the structure illustrated in FIG. 12 was produced. When the produced apparatus was operated, the dust on the surface of the imaging unit was satisfactorily removed, and an image without a dust defect was obtained.

Example 38

Through the use of the piezoelectric element of Example 1, the electronic equipment having the structure illustrated in FIG. 14 was produced. It was confirmed that the speaker operated in accordance with an applied alternating voltage.

Example 39

Through the use of the multilayered piezoelectric element of Example 30, the liquid ejection head having the structure illustrated in FIG. 3B was produced. It was confirmed that ink was emitted in accordance with an input electric signal.

Example 40

Through the use of the liquid ejection head of Example 39, the liquid ejection apparatus having the structure illustrated in FIG. 4 was produced. It was confirmed that ink was emitted on a recording medium in accordance with an input electric signal.

Example 41

Through the use of the multilayered piezoelectric element of Example 30, the ultrasonic motor having the structure illustrated in FIG. 6E was produced. It was confirmed that the motor rotated in accordance with an applied alternating voltage.

Example 42

Through the use of the ultrasonic motor of Example 41, the optical equipment having the structure illustrated in FIGS. 7A and 7B was produced. It was confirmed that the automatic focus operation was performed in accordance with an applied alternating voltage.

Example 43

Through the use of the multilayered piezoelectric element of Example 30, the dust removing apparatus having the structure illustrated in FIGS. 9A and 9B was produced. Plastic beads were scattered, and an alternating voltage was applied. Then, satisfactory dust removing efficiency was confirmed.

Example 44

Through the use of the dust removing apparatus of Example 43, the imaging apparatus having the structure illustrated in FIG. 12 was produced. When the produced apparatus was operated, the dust on the surface of the imaging unit was satisfactorily removed, and an image without a dust defect was obtained.

Example 45

Through the use of the multilayered piezoelectric element of Example 30, the electronic equipment having the structure illustrated in FIG. 14 was produced. It was confirmed that the speaker operated in accordance with an applied alternating voltage.

The piezoelectric material of the present invention has a satisfactory and stable piezoelectric constant and electric insulation property in a wide practical temperature range. Further, the piezoelectric material of the present invention has a small load on the environment because it is free of lead. Accordingly, the piezoelectric material of the present invention can be used without any problem for various types of equipment using a piezoelectric material such as a liquid ejection head, a liquid ejection apparatus, an ultrasonic motor, an optical equipment, a vibration apparatus, a dust removing apparatus, an imaging apparatus, and an electronic equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-071016, filed Mar. 29, 2013, which is hereby incorporated by reference herein in its entirety.

What is claimed is:

1. A piezoelectric material, comprising a perovskite-type metal oxide represented by the following general formula (1) as a main component, the piezoelectric material containing Mn in a content of 0.01 part by weight or more and 0.80 part by weight or less with respect to 100 parts by weight of the perovskite-type metal oxide:

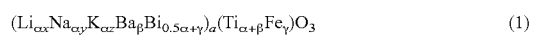

$$(Li_{\alpha x}Na_{\alpha y}K_{\alpha z}Ba_\beta Bi_{0.5\alpha+\gamma})_a(Ti_{\alpha+\beta}Fe_\gamma)O_3 \quad (1)$$

where $0.800 \leq \alpha \leq 0.999$, $0 \leq \beta \leq 0.150$, $0.001 \leq \gamma \leq 0.050$, $\alpha+\beta+\gamma=1$, $0 \leq x \leq 0.050$, $0.045 \leq y \leq 0.450$, $0.045 \leq z \leq 0.450$, $0.450 \leq x+y+z \leq 0.500$, and $0.980 \leq a \leq 1.020$.

2. The piezoelectric material according to claim 1, wherein the piezoelectric material satisfies a relationship: $2\alpha y + \beta \geq 2\alpha(x+z)$.

3. The piezoelectric material according to claim 2, wherein the piezoelectric material satisfies a relationship: $2\alpha y + \beta \geq 4.6\alpha(x+z)$.

4. The piezoelectric material according to claim 1, wherein the piezoelectric material satisfies a relationship: $0.002 \leq \gamma \leq 0.020$.

5. The piezoelectric material according to claim 1, wherein the piezoelectric material has a depolarization temperature of 140° C. or more.

6. The piezoelectric material according to claim 1, wherein the piezoelectric material contains crystal grains having an average equivalent circle diameter of 0.3 µm or more and 10 µm or less.

7. The piezoelectric material according to claim 1, wherein the piezoelectric material has a relative density of 93% or more and 100% or less.

8. A piezoelectric element, comprising at least a first electrode, a piezoelectric material portion, and a second electrode,
wherein the piezoelectric material portion includes the piezoelectric material according to claim 1.

9. A multilayered piezoelectric element, comprising two or more piezoelectric material layers and two or more electrode layers including one or more internal electrode, which are stacked alternately,
wherein the piezoelectric material layer includes the piezoelectric material according to claim 1.

10. The multilayered piezoelectric element according to claim 9, wherein the internal electrode contains Ag and Pd, and a weight ratio M1/M2 between a containing weight M1 of the Ag and a containing weight M2 of the Pd satisfies a relationship: $0.25 \leq M1/M2 \leq 4.0$.

11. The multilayered piezoelectric element according to claim 9, wherein the internal electrode contains at least one of Ni or Cu.

12. A liquid ejection head, comprising at least:
a liquid chamber including a vibration portion containing the piezoelectric element according to claim 8; and
an ejection orifice communicating with the liquid chamber.

13. A liquid ejection apparatus, comprising:
a stage configured to receive an object; and
the liquid ejection head according to claim 12.

14. An ultrasonic motor, comprising at least:
a vibrating body containing the piezoelectric element according to claim 8; and
a rotor which comes into contact with the vibrating body.

15. An optical equipment, comprising a drive unit including the ultrasonic motor according to claim 14.

16. A vibration apparatus, comprising a vibrating body containing a diaphragm and the piezoelectric element according to claim 8 disposed on the diaphragm.

17. A dust removing apparatus, comprising a vibration portion including the vibration apparatus according to claim 16.

18. An imaging apparatus, comprising at least:
the dust removing apparatus according to claim 17; and
an imaging element unit,
wherein the dust removing apparatus includes the diaphragm provided on a light receiving surface of the imaging element unit.

19. An electronic equipment, comprising a piezoelectric acoustic component including the piezoelectric element according to claim 8.

20. A liquid ejection head, comprising at least:
a liquid chamber including a vibration portion containing the multilayered piezoelectric element according to claim 9; and
an ejection orifice communicating with the liquid chamber.

21. A liquid ejection apparatus, comprising:
a stage configured to receive an object; and
the liquid ejection head according to claim 20.

22. An ultrasonic motor, comprising at least:
a vibrating body containing the multilayered piezoelectric element according to claim 9; and
a rotor which comes into contact with the vibrating body.

23. An optical equipment, comprising a drive unit including the ultrasonic motor according to claim 22.

24. A vibration apparatus, comprising a vibrating body containing a diaphragm and the multilayered piezoelectric element according to claim 9 disposed on the diaphragm.

25. A dust removing apparatus, comprising a vibration portion including the vibration apparatus according to claim 24.

26. An imaging apparatus, comprising at least:
the dust removing apparatus according to claim 25; and
an imaging element unit,
wherein the dust removing apparatus includes the diaphragm provided on a light receiving surface of the imaging element unit.

27. An electronic equipment, comprising a piezoelectric acoustic component including the multilayered piezoelectric element according to claim 9.

* * * * *